(12) United States Patent
     Tomoyama

(10) Patent No.: US 11,056,494 B2
(45) Date of Patent: Jul. 6, 2021

(54) INTEGRATED ASSEMBLIES HAVING BITLINE CONTACTS, AND METHODS OF FORMING INTEGRATED ASSEMBLIES

(71) Applicant: Micron Technology, Inc., Boise, ID (US)

(72) Inventor: Tsuyoshi Tomoyama, Hiroshima (JP)

(73) Assignee: Micron Technology, Inc., Boise, ID (US)

( * ) Notice: Subject to any disclaimer, the term of this patent is extended or adjusted under 35 U.S.C. 154(b) by 83 days.

(21) Appl. No.: 16/653,658

(22) Filed: Oct. 15, 2019

(65) Prior Publication Data
     US 2020/0043934 A1    Feb. 6, 2020

Related U.S. Application Data

(62) Division of application No. 16/010,779, filed on Jun. 18, 2018, now Pat. No. 10,573,654.

(51) Int. Cl.
     *H01L 27/108*    (2006.01)

(52) U.S. Cl.
     CPC .. *H01L 27/10888* (2013.01); *H01L 27/10814* (2013.01); *H01L 27/10823* (2013.01); *H01L 27/10855* (2013.01); *H01L 27/10885* (2013.01); *H01L 27/10894* (2013.01); *H01L 27/10897* (2013.01)

(58) Field of Classification Search
     CPC ......... H01L 27/10888; H01L 27/10855; H01L 27/10814; H01L 27/10885; H01L 27/10894; H01L 27/10891; H01L 27/10876; H01L 27/10823; H01L 27/10897; H01L 27/108
     See application file for complete search history.

(56) References Cited

U.S. PATENT DOCUMENTS

| 8,704,299 | B2 | 4/2014 | Oyu et al. | |
|---|---|---|---|---|
| 2007/0246803 | A1* | 10/2007 | Haller | H01L 27/1052 257/640 |
| 2011/0256678 | A1* | 10/2011 | Kim | H01L 21/76897 438/239 |
| 2013/0009226 | A1 | 1/2013 | Park et al. | |

(Continued)

*Primary Examiner* — Thanh T Nguyen
(74) *Attorney, Agent, or Firm* — Wells St. John P.S.

(57) ABSTRACT

Some embodiments include an integrated assembly having a paired-memory-cell-region within a memory-array-region. The paired-memory-cell-region includes a bitline-contact-structure between a first charge-storage-device-contact-structure and a second charge-storage-device-contact-structure. A first insulative region is between the bitline-contact-structure and the first charge-storage-device-contact-structure. A second insulative region is between the bitline-contact-structure and the second charge-storage-device-contact-structure. The first and second insulative regions both include a first semiconductor material which is in a nonconductive configuration. A transistor gate is over a peripheral region proximate the memory-array-region. The transistor gate has a second semiconductor material which is a same semiconductor composition and thickness as the first semiconductor material, but which is in a conductive configuration. Some embodiments include methods of forming integrated assemblies.

17 Claims, 22 Drawing Sheets

(56) References Cited

U.S. PATENT DOCUMENTS

2014/0061742 A1* 3/2014 Nishitani .......... H01L 27/10823
257/296
2015/0035022 A1 2/2015 Chung
2016/0159974 A1 6/2016 Park et al.
2019/0096890 A1* 3/2019 Lee .................. H01L 27/10855

* cited by examiner

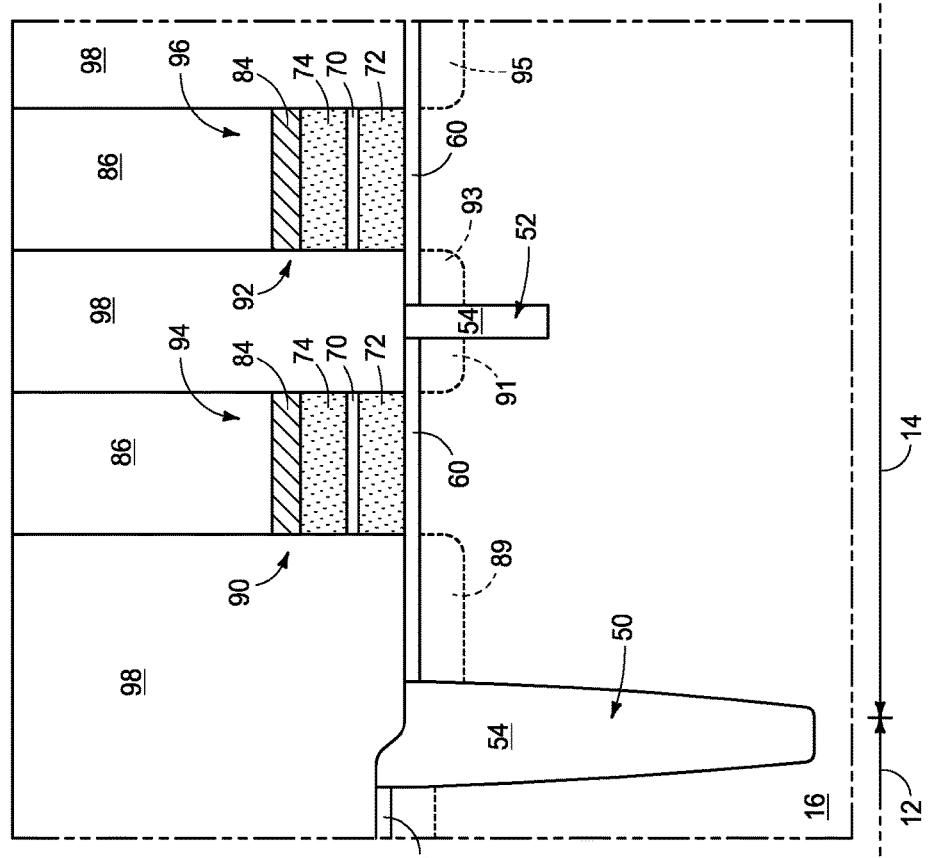
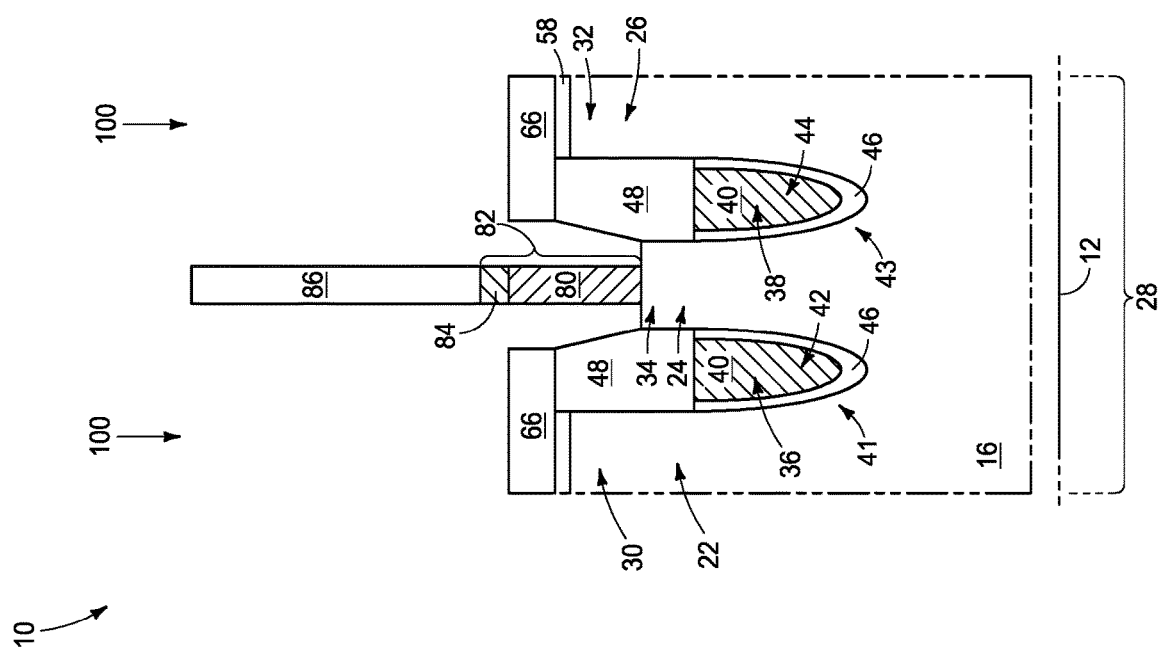
FIG. 15

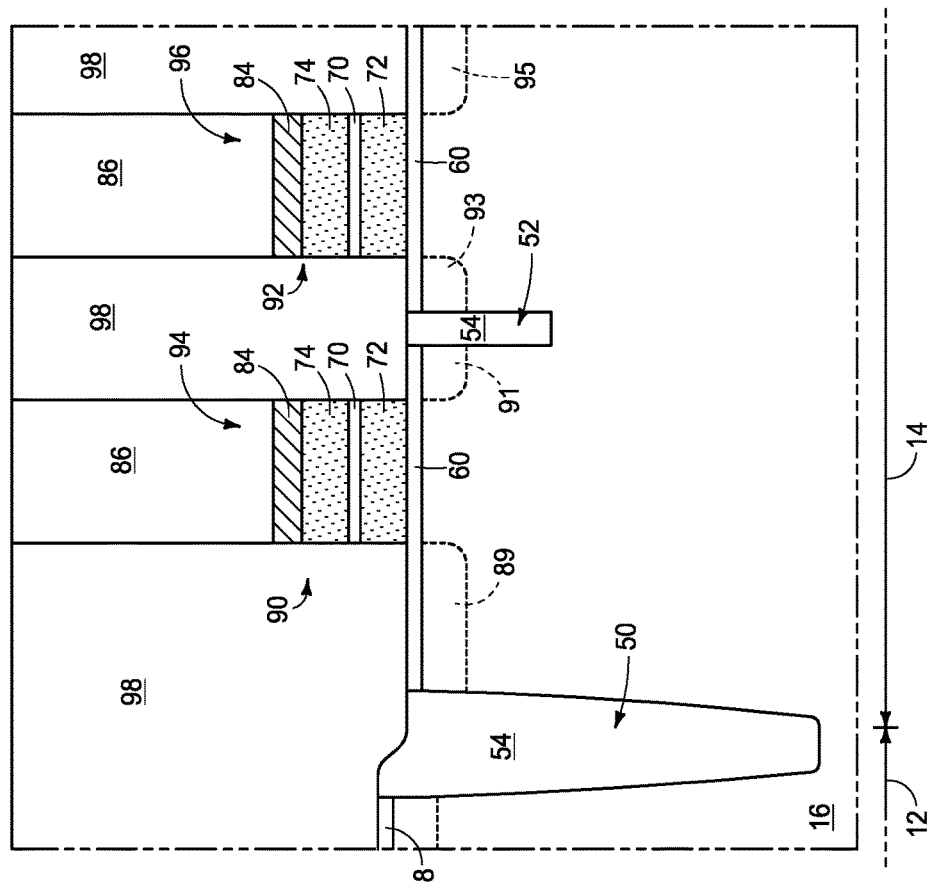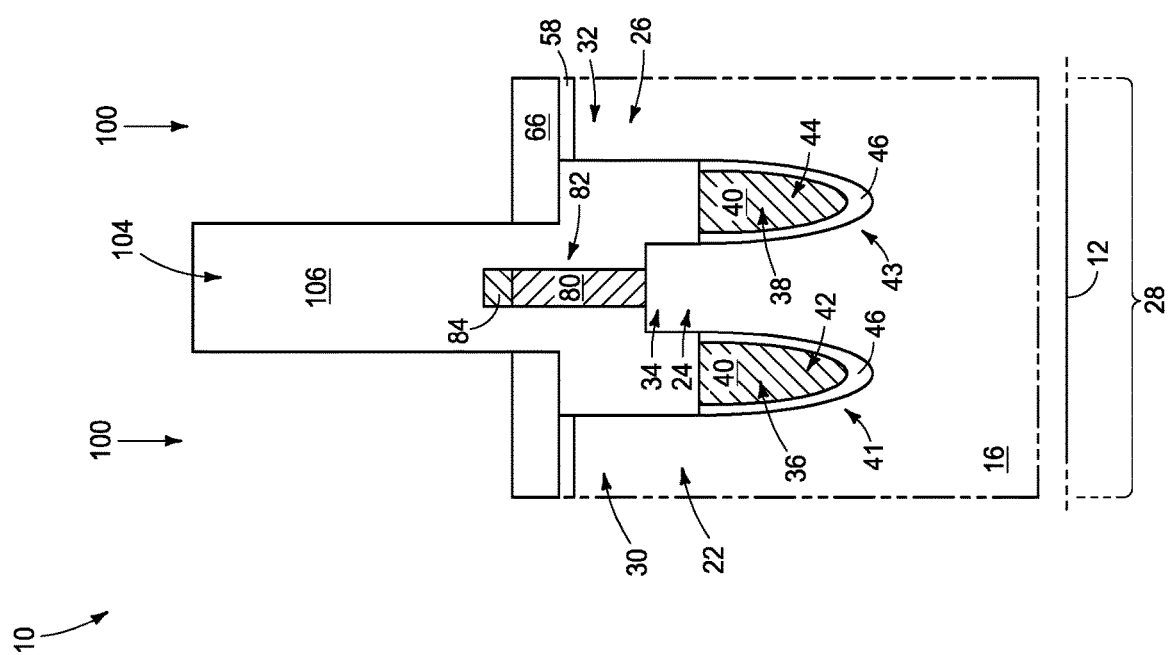
FIG. 17

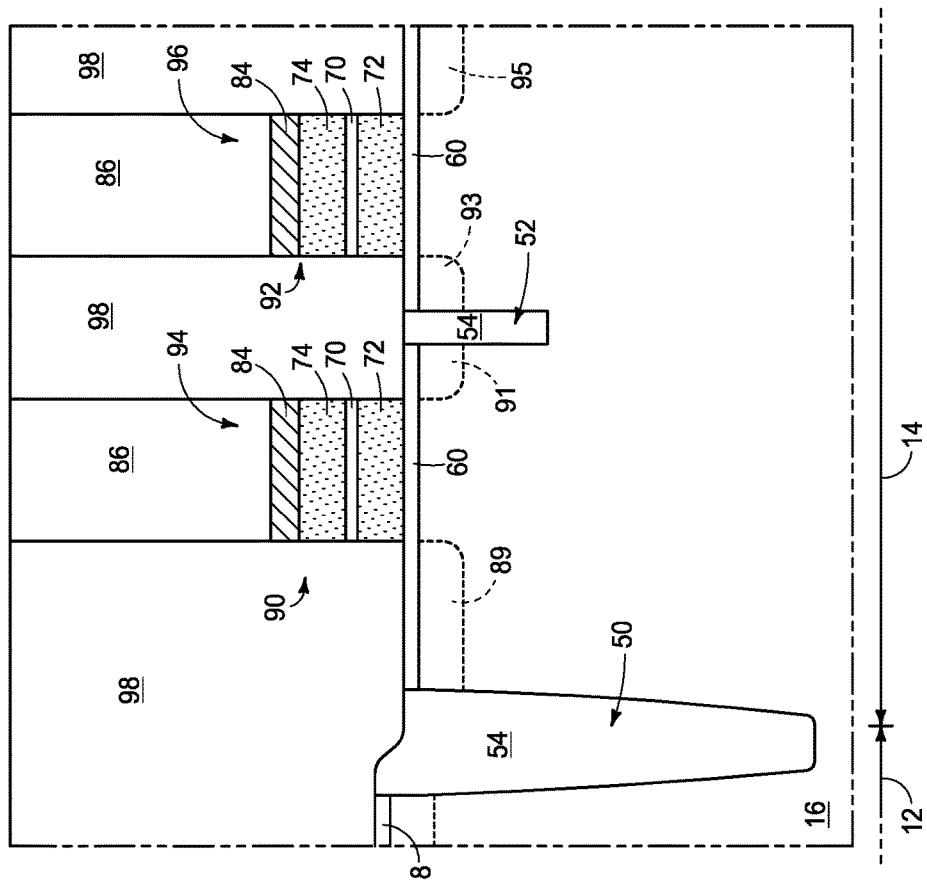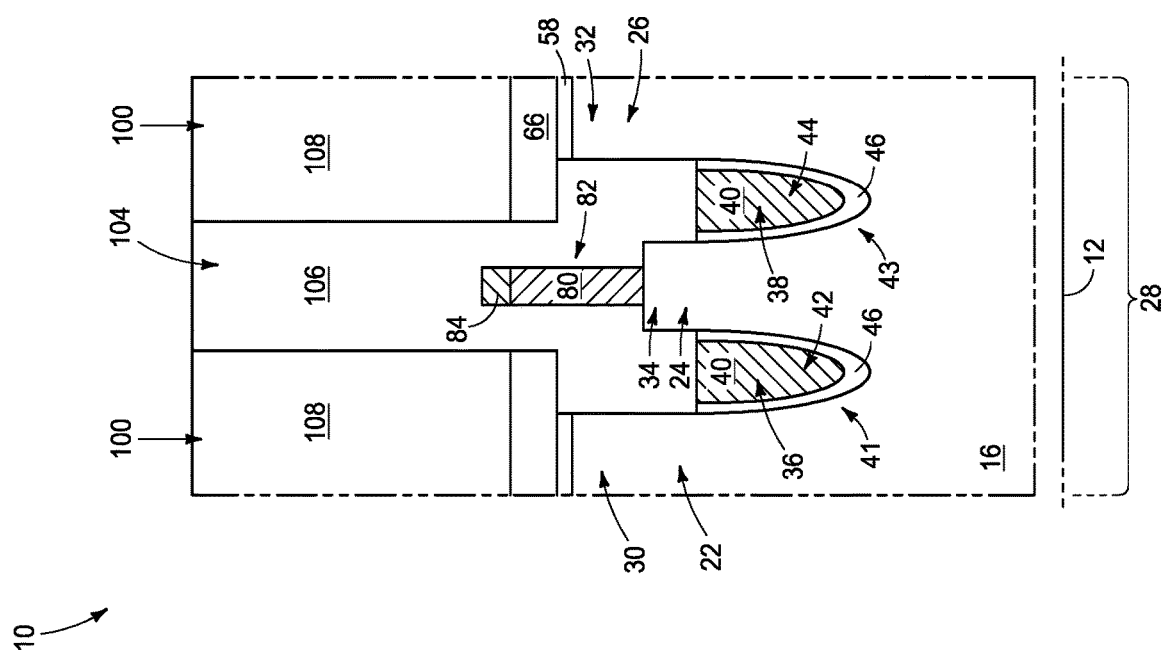
FIG. 18

INTEGRATED ASSEMBLIES HAVING BITLINE CONTACTS, AND METHODS OF FORMING INTEGRATED ASSEMBLIES

RELATED PATENT DATA

This patent resulted from a divisional of U.S. patent application Ser. No. 16/010,779 which was filed Jun. 18, 2018, and which is hereby incorporated herein by reference.

TECHNICAL FIELD

Integrated assemblies having bitline contacts, and methods of forming integrated assemblies.

BACKGROUND

Memory is one type of integrated circuitry, and is used in electronic systems for storing data. Integrated memory is usually fabricated in one or more arrays of individual memory cells. The memory cells are configured to retain or store memory in at least two different selectable states. In a binary system, the states are considered as either a "0" or a "1". In other systems, at least some individual memory cells may be configured to store more than two levels or states of information.

An example memory is dynamic random-access memory (DRAM). The DRAM unit cells may each comprise a capacitor in combination with a transistor. Charge stored on the capacitors of the DRAM unit cells may correspond to memory bits.

An integrated memory array may be formed over a region of a semiconductor die, and such region of the die may be referred to as a memory-array-region. The memory-array-region may be proximate to another region of the die which is peripheral to the memory array, and which may be referred to as a peripheral region.

Integrated circuit components are often associated with the peripheral region of the semiconductor die. Such components may include, for example, processor circuitry, wiring, etc. Additional integrated circuit components are associated with the memory-array-region. Such components may include memory cells, wordlines, bitlines, etc. It is desired to develop processing which utilizes common process steps to fabricate integrated structures associated with the memory-array-region and integrated structures associated with the peripheral region. It is also desired to develop architectures formed utilizing such processing.

BRIEF DESCRIPTION OF THE DRAWINGS

FIGS. 1-21 are diagrammatic cross-sectional views of regions of an integrated assembly at example process stages of an example method for fabricating an example structure.

DETAILED DESCRIPTION OF THE ILLUSTRATED EMBODIMENTS

Some embodiments include architectures associated with a memory-array-region; with the architectures having bitline-contact-structures spaced from charge-storage-device-contact-structures by insulative regions. Some of the insulative material within such insulative regions includes semiconductor material which is not conductively-doped, and which instead is in a nonconductive (i.e., electrically-insulative) configuration. The semiconductor material has a thickness and a semiconductor composition; and in some embodiments semiconductor material having the same thickness and semiconductor composition is included within gates of transistors associated with a peripheral region proximate to the memory-array-region, with the semiconductor material within such gates being in a conductive configuration (i.e., being conductively-doped). Some embodiments include methods of forming integrated assemblies. The methods may include forming a common semiconductor material across a memory-array-region and across a peripheral region proximate to the memory-array-region. A portion of the semiconductor material may be left in a nonconductive configuration and incorporated into insulative regions associated with the memory-array-region; and a portion of the semiconductor material may be conductively-doped and incorporated into conductive structures associated with the peripheral region. Example embodiments are described with reference to FIGS. 1-22.

Figure 1:
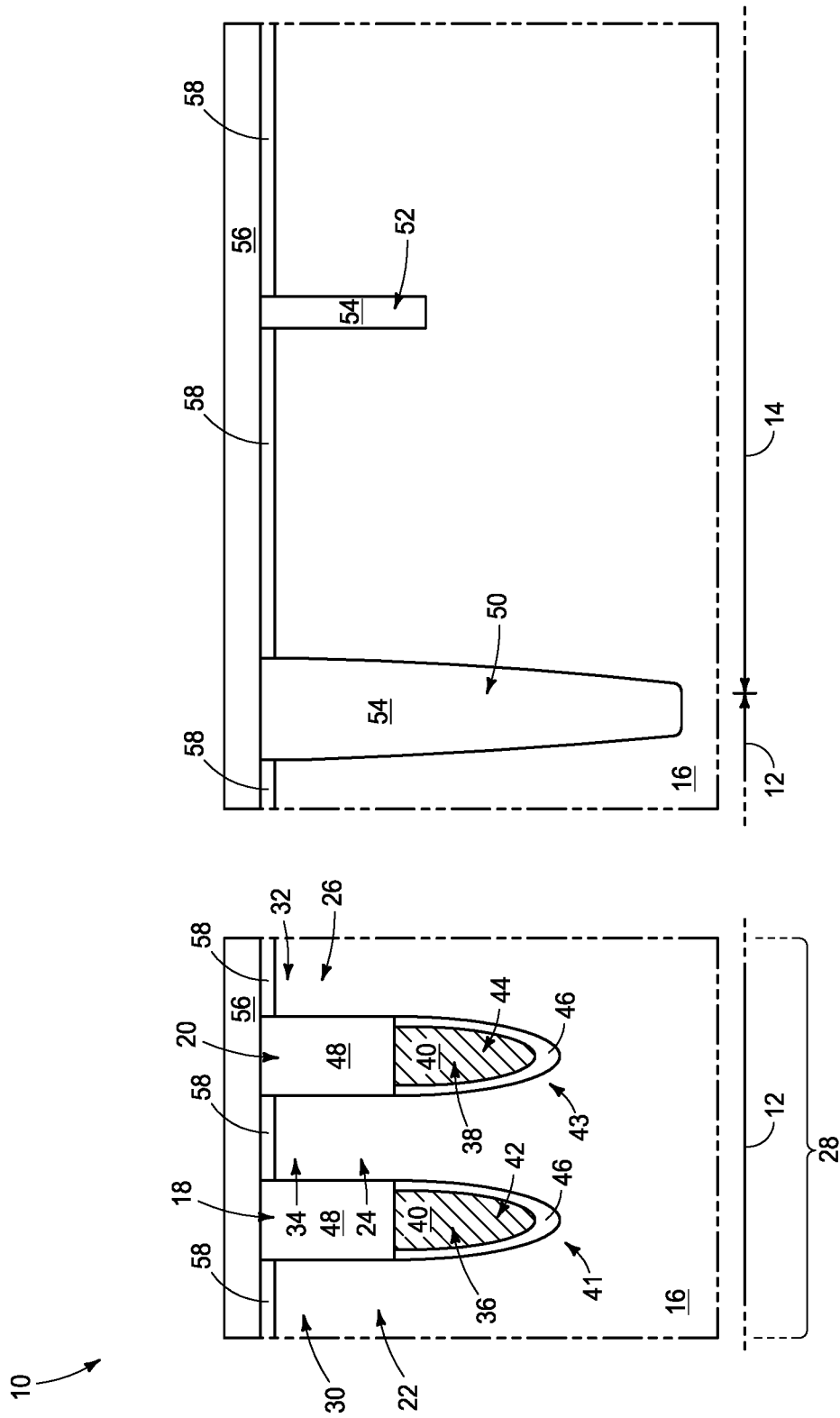

Referring to FIG. 1, a pair of segments of a construction 10 are illustrated at an example process stage. One of the segments (shown as a left panel of FIG. 1) is a portion of a memory-array-region 12, and the other of the segments (shown as a right panel of FIG. 1) includes another portion of the memory-array-region 12 together with a portion of a region 14 peripheral to the memory-array-region. The region 14 may be referred to as a peripheral region.

A base-semiconductor-material 16 is within the memory-array-region 12 and the peripheral region 14. The base-semiconductor-material 16 may comprise any suitable composition(s); and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15). In some example embodiments, the base-semiconductor-material may comprise, consist essentially of, or consist of silicon (e.g., monocrystalline silicon).

The base-semiconductor-material 16 may be referred to as being part of a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above.

Neighboring trenches 18 and 20 have been formed to extend into the base-semiconductor-material 16 within the memory-array-region 12. The trenches 18 and 20 may be referred to as a first trench and a second trench, respectively, to distinguish them from one another.

The neighboring trenches 18 and 20 subdivide the base-semiconductor-material 16 into three pillars 22, 24 and 26 along the cross-section of FIG. 1. The pillars 22, 24 and 26 may be referred to as first, second and third pillars, respectively, in order to distinguish them from one another. The first pillar 22 is on one side of the trench 18, and the second pillar 24 is on an opposing side of the trench 18 from the first pillar 22. Similarly, the third pillar 26 is on one side of the trench 20, and the second pillar 24 is on an opposing side of the trench 20 from the first pillar.

The trenches 18 and 20, and the pillars 22, 24 and 26, may be considered together to represent a paired-memory-cell-region 28. Two memory cells will be fabricated in the region 28 (with such memory cells being shown in FIG. 21 and described below).

Referring still to FIG. 1, an upper region of the first pillar 22 may be considered to comprise a first charge-storage-device-contact-location 30, an upper region of the third pillar 26 may be considered to comprise a second charge-storage-device-contact-location 32, and an upper region of the second pillar 24 may be considered to comprise a bitline-contact-location 34.

A first wordline 36 is formed within the first trench 18, and a second wordline 38 is formed within the second trench 20. The first and second wordlines 36 and 38 extend in and out of the page relative to the cross-sectional view of FIG. 1.

The first and second wordlines 36 and 38 comprise conductive material 40. The conductive material 40 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

The first wordline 36 comprises a transistor gate 42 along the cross-section of FIG. 1, and the second wordline 38 comprises a transistor gate 44 along such cross-section. The transistor gate 42 may be referred to as a first transistor gate (or first gate), and the transistor gate 44 may be referred to as a second transistor gate (or second gate), to distinguish the transistor gates from one another.

Dielectric material 46 separates the transistor gates 42 and 44 from the base-semiconductor-material 16. The dielectric material 46 may comprise any suitable composition(s); and in some embodiments may comprise, consist essentially of, or consist of silicon dioxide. The dielectric material 46 may be referred to as a gate dielectric material.

The charge-storage-device-contact-locations 30 and 32, and the bitline-contact-location 34, may comprise appropriate dopant to correspond to source/drain regions; and such source/drain regions may be coupled to one another through channel regions 41 and 43 extending under the transistor gates 42 and 44. The transistor gates 42 and 44 may gatedly control the channel regions, and accordingly the source/drain regions may be gatedly coupled to one another. Specifically, the transistor gate 42 may gatedly couple the first charge-storage-device-contact-location 30 with the bitline-contact-location 34; and the transistor gate 44 may gatedly couple the second charge-storage-device-contact-location 32 with the bitline-contact-location 34. The regions 30, 32 and 34 may be conductively-doped at the process stage of FIG. 1 (with such doping not being shown in order to simplify the drawing); or one or more of such regions may be doped at a later process stage.

Insulative material 48 is within the first and second trenches 18 and 20, and over the wordlines 36 and 38. The insulative material 48 may comprise any suitable composition(s); and in some embodiments may comprise, consist essentially of, or consist of one or both of silicon dioxide and silicon nitride.

The paired-memory-cell-region 28 may be representative of a large number of substantially-identical paired-memory-cell-regions provided within the memory-array-region 12 at the processing stage of FIG. 1; with the term "substantially identical" meaning identical to within reasonable tolerances of fabrication and measurement. For instance, there may be hundreds, thousands, millions, etc., of paired-memory-cell-regions provided within the memory-array-region 12 at the processing stage of FIG. 1. The paired memory-array-regions may be separated from one another with insulative regions (not shown).

A pair of insulative isolation regions 50 and 52 are shown provided within the peripheral region 14. The regions 50 and 52 are filled with insulative material 54. Such insulative material may comprise any suitable composition(s); and in some embodiments may comprise, consist essentially of, or consist of silicon oxide. The isolation region 50 may be utilized to electrically separate integration associated with the peripheral region 14 from integration associated with the memory-array-region 12. The isolation region 52 is an optional isolation region, and may be utilized for separating source/drain regions of adjacent transistors from one another (with such adjacent transistors being shown in FIG. 13 and described below).

A layer of silicon nitride 56 is over the base-semiconductor-material 16, and is spaced from the base-semiconductor-material by an oxide 58. The oxide 58 may be considered to correspond to a pad oxide which protects the base-semiconductor-material 16 from stresses which may occur if the nitride 56 directly contacts the base 16. In some embodiments, the oxide 58 may comprise, consist essentially of, or consist of silicon dioxide.

Figure 2:
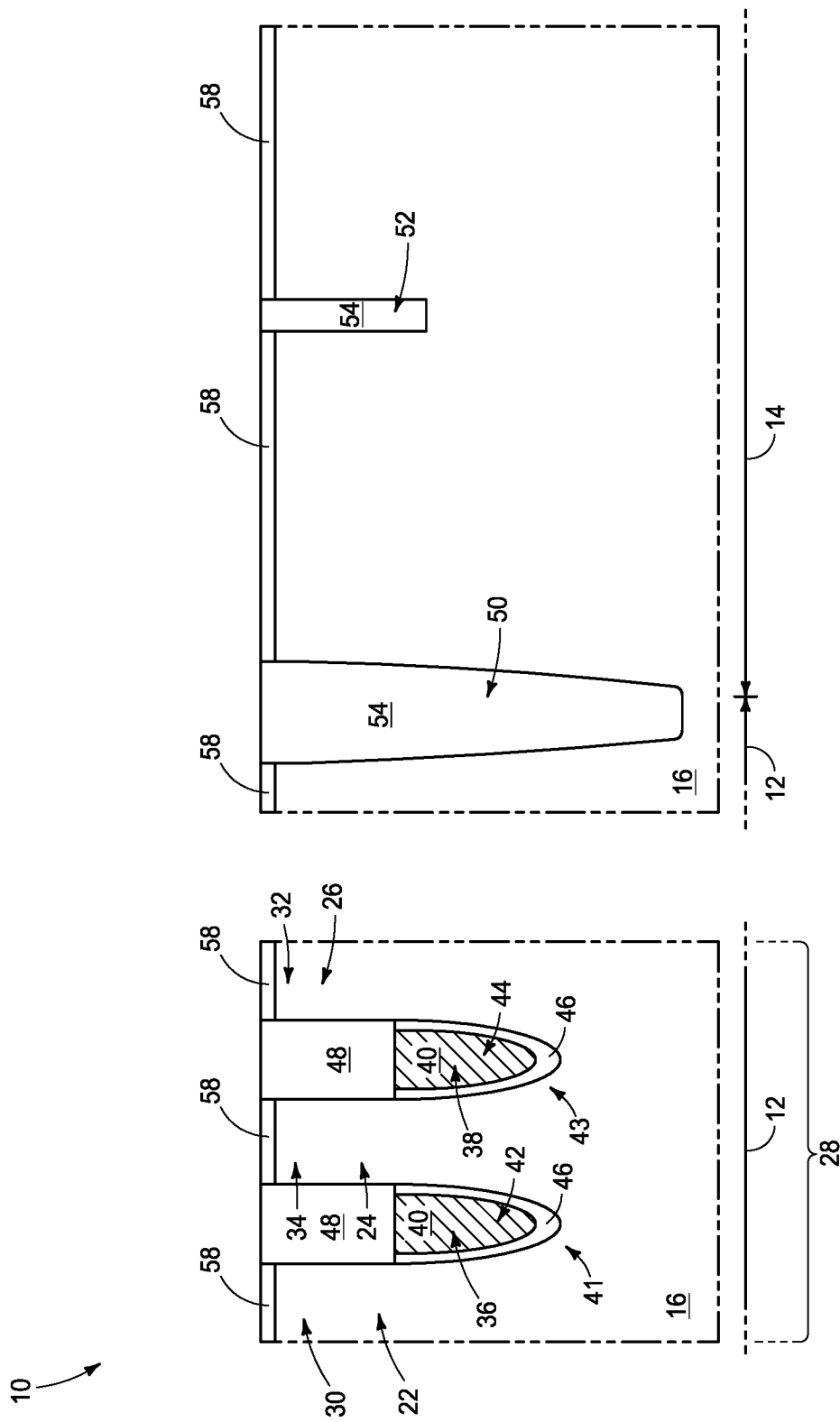

Referring to FIG. 2, the silicon nitride 56 is removed with suitable processing (e.g., dry etching, chemical-mechanical polishing, etc.).

Figure 3:
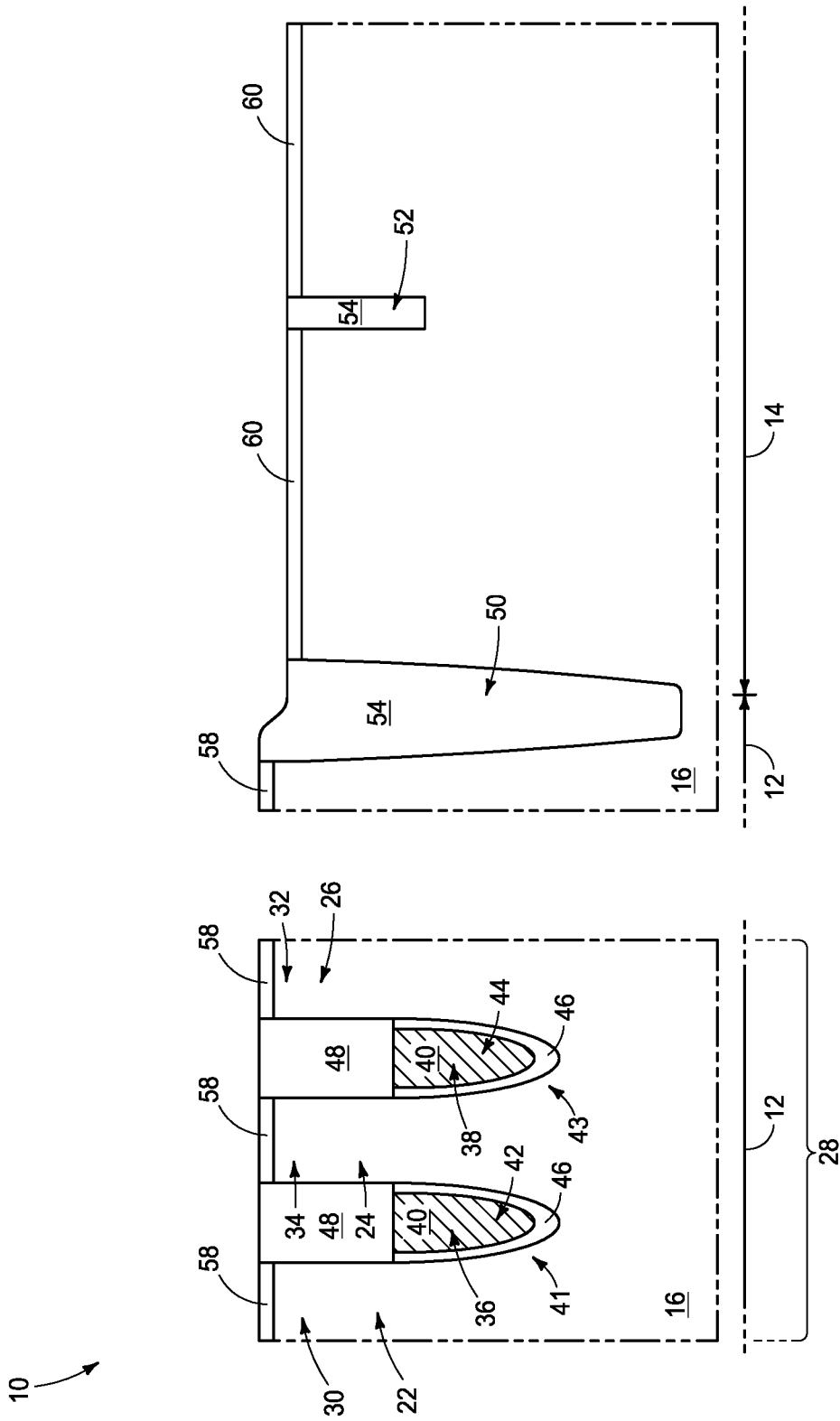

Referring to FIG. 3, a portion of the peripheral region 14 is exposed to an etch to remove the oxide 58, and to expose an upper surface of the base-semiconductor-material 16. Subsequently, a new oxide 60 is formed across the upper surface of the base-semiconductor-material 16. The new oxide is suitable for utilization as gate dielectric of transistor devices; and in some embodiments may comprise, consist essentially of, or consist of silicon oxide. Portions of construction 10 which are not to be etched during the removal of the oxide 58 may be protected with a mask (not shown), which is subsequently removed.

Figure 4:
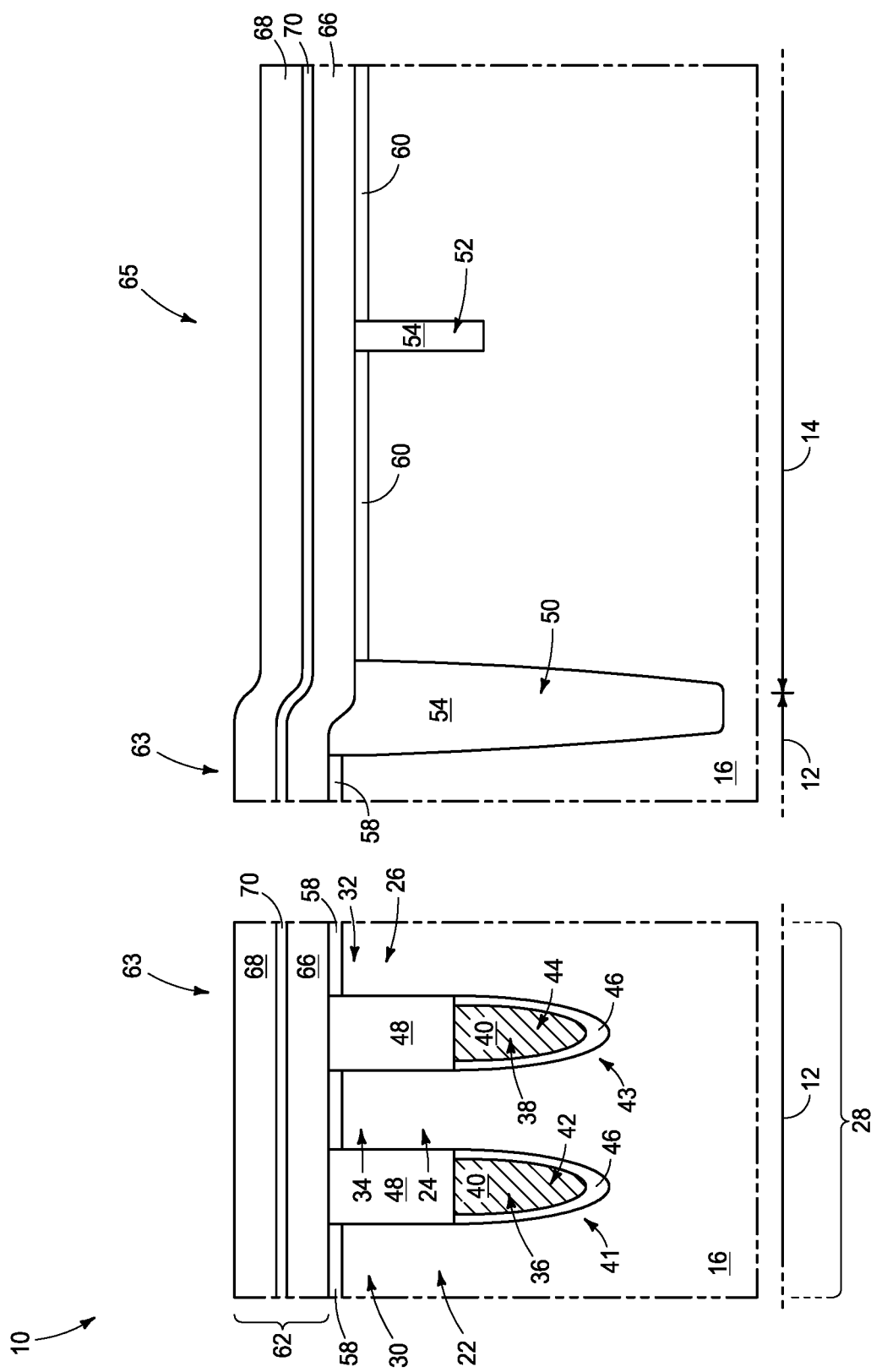

Referring to FIG. 4, a stack 62 is formed across the memory-array-region 12 and the peripheral region 14. The stack may be considered to comprise a first portion 63 over the memory-array-region 12, and to comprise a second portion 65 over the peripheral region 14.

The stack 62 includes a first semiconductor material 66, a second semiconductor material 68, and an insulative material 70 between the first and second semiconductor materials.

The semiconductor materials 66 and 68 are not conductively-doped at the processing stage of FIG. 4, and instead are in a nonconductive configuration. The nonconductive semiconductor materials 66 and 68 comprise dopant concentrations low enough that the materials 66 and 68 remain electrically insulative (e.g., may comprise dopant concentrations less than or equal to about $10^{15}$ atoms/cm$^3$); which includes, but is not limited to, configurations in which the materials 66 and 68 comprise effectively no measurable dopant therein.

The semiconductor materials 66 and 68 may comprise any suitable composition(s); and in some embodiments may comprise, consist essentially of, or consist of one or more of silicon, germanium, III/V semiconductor material (e.g., gallium phosphide), semiconductor oxide, etc. The semiconductor materials 66 and 68 may be a same semiconductor composition as one another, or may be different semiconductor compositions relative to one another. In some embodiments, the semiconductor materials 66 and 68 may both comprise, consist essentially of, or consist of silicon (e.g., may both comprise, consist essentially of, or consist of polycrystalline silicon).

The semiconductor materials 66 and 68 may be of any suitable thicknesses; and in some embodiments may comprise thicknesses within a range of from about 10 angstroms (Å) to about 50 nanometers (nm). The semiconductor materials 66 and 68 may be about the same thickness as one another (with the term "about the same" meaning the same to within reasonable tolerances of fabrication and measurement), or may be different thicknesses relative to one another.

The insulative material 70 may comprise any suitable composition(s), including, for example, one or both of silicon dioxide and silicon nitride. In some embodiments, the insulative material 70 may comprise, consist essentially of, or consist of silicon dioxide.

Figure 6:
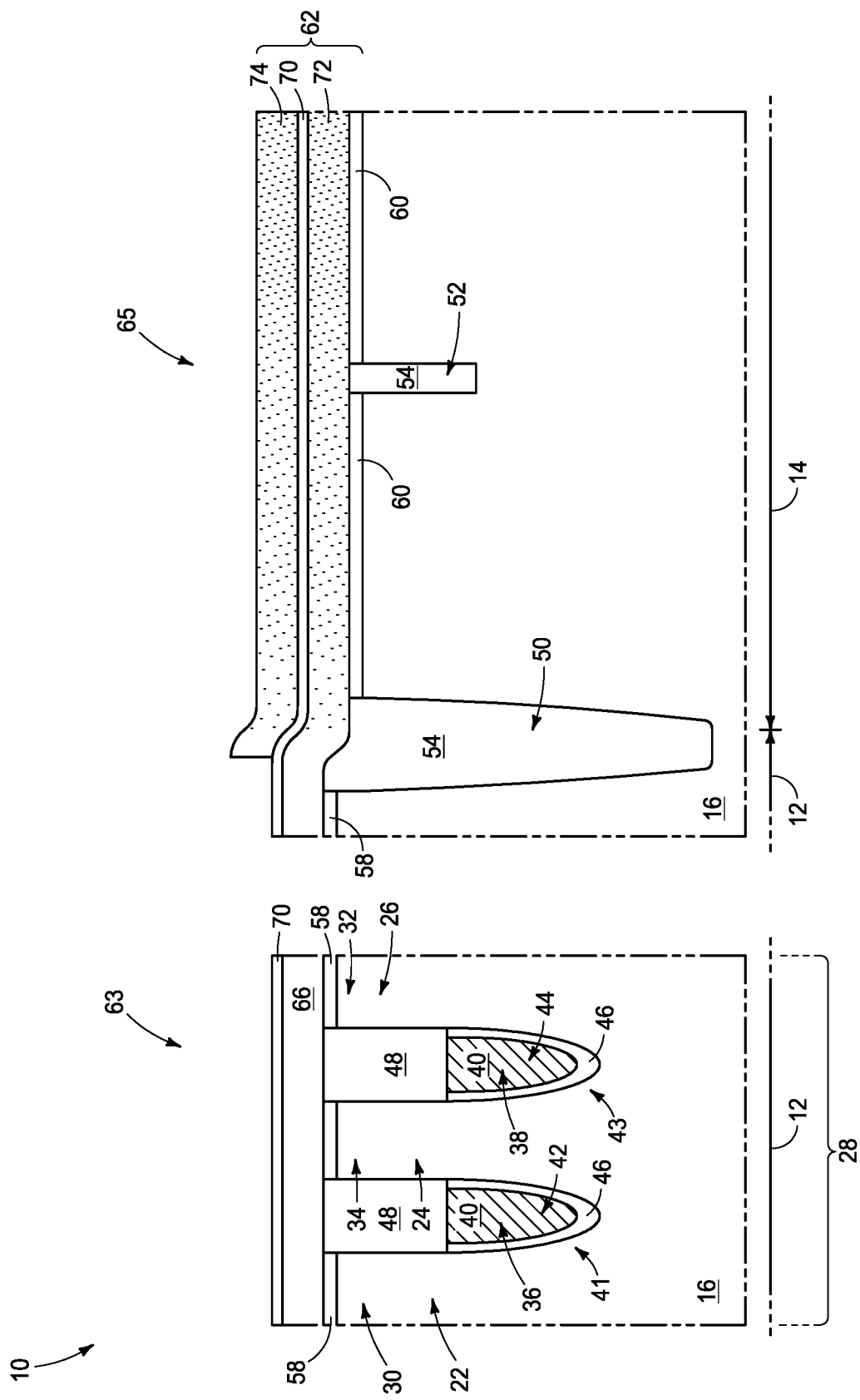
Figure 13:
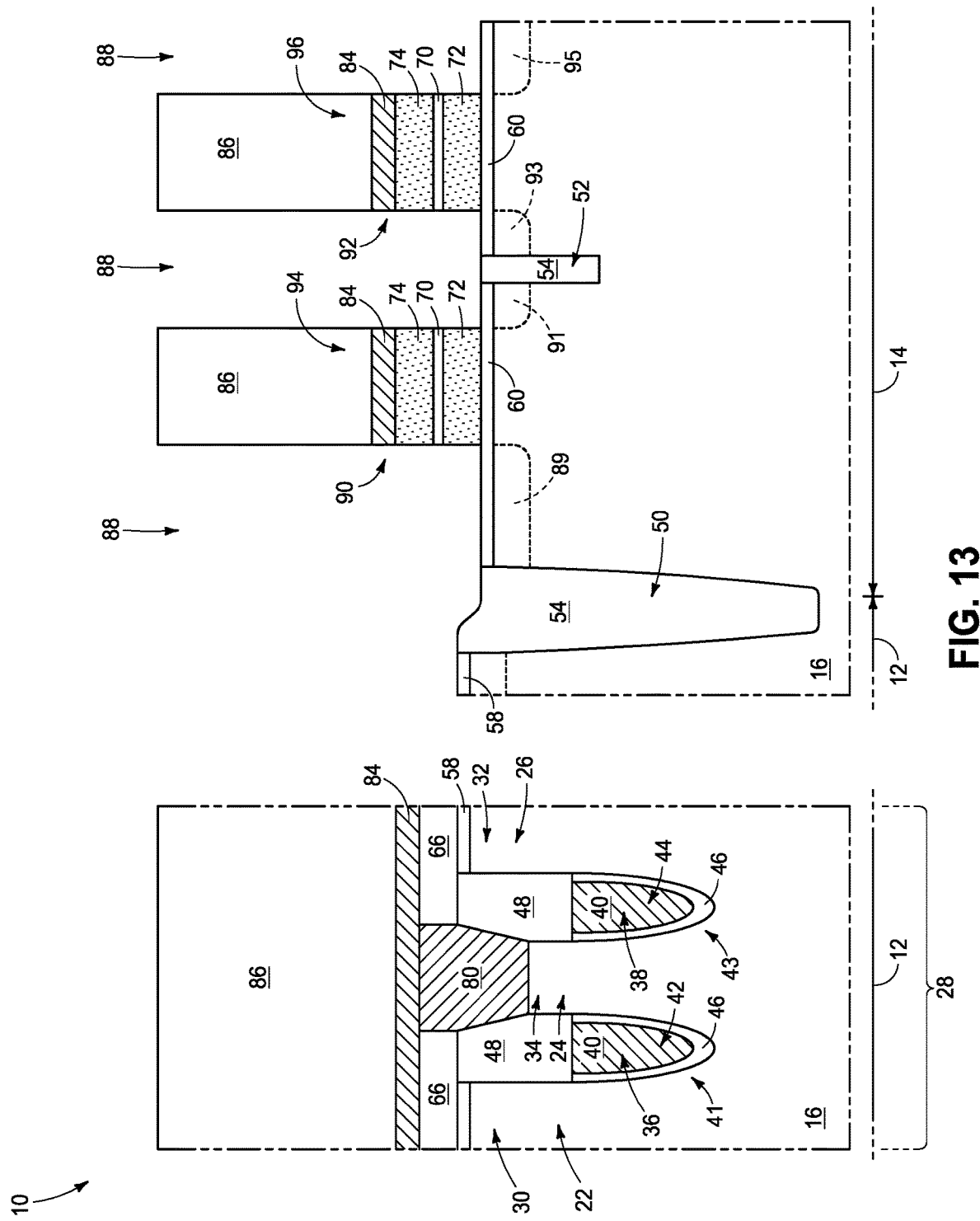

A region of the insulative material 70 functions as an etch-stop during a process step of FIG. 6, and other regions of the insulative material 70 are incorporated into transistor gates at a process step of FIG. 13. The insulative material 70 is preferably kept thin enough so that it does not adversely interfere with the performance of the transistor gates of FIG. 13, and yet is also preferably kept thick enough so that it is a suitable etch-stop. In some embodiments, the insulative material 70 will be formed to a thickness within a range of from greater than or equal to about 10 Å to less than or equal to about 100 Å; and in some embodiments will be formed to a thickness within a range of from greater than or equal to about 10 Å to less than or equal to about 50 Å.

Figure 5:
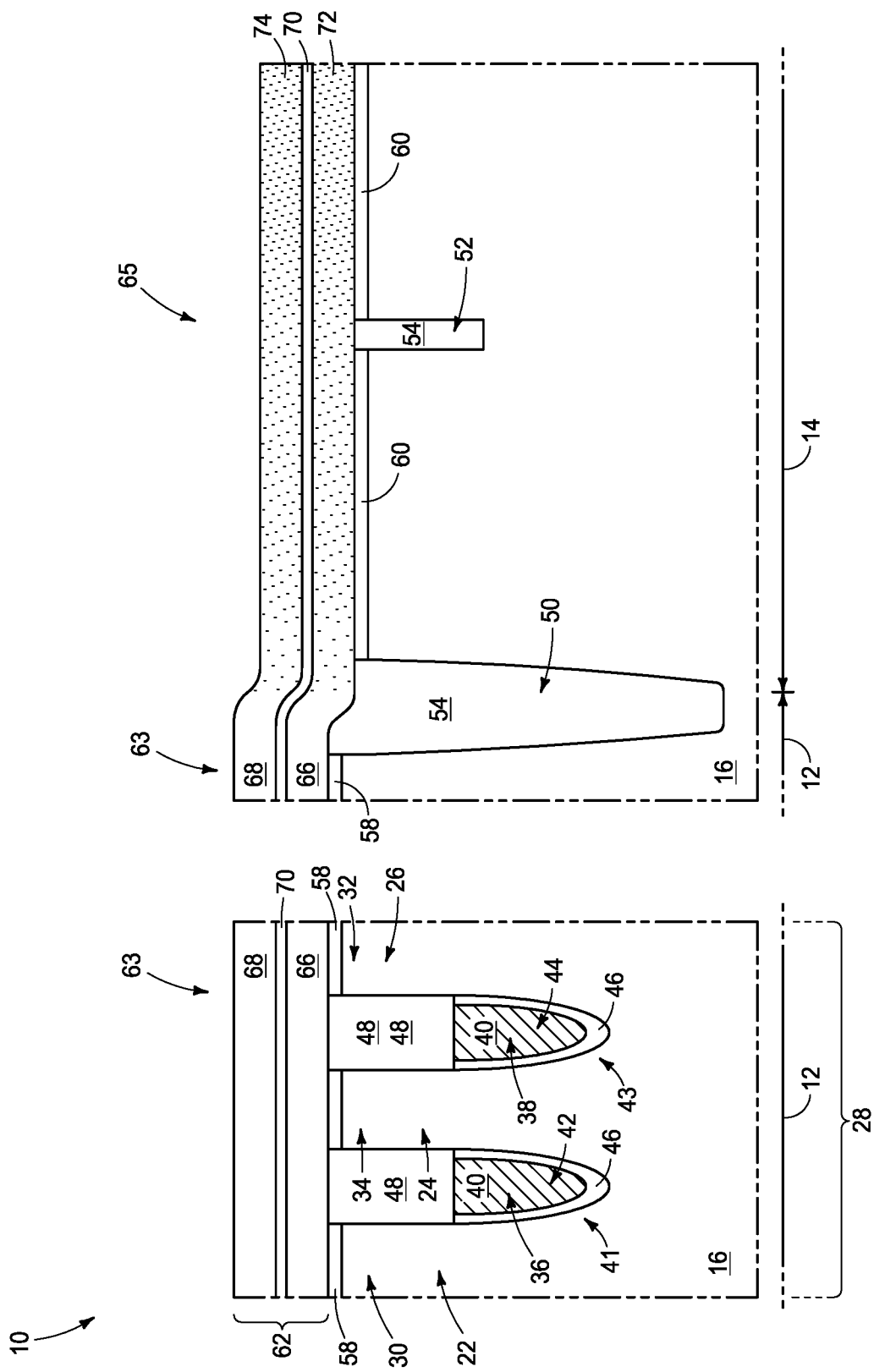

Referring to FIG. 5, conductivity-enhancing dopant is implanted into the second portion 65 of stack 62 and not into the first portion 63 of the stack. Such may be accomplished by providing a protective mask (not shown) over the first portion 63 of the stack 62 while implanting the conductivity-enhancing dopant into the second portion 65. The dopant may be provided to a heavy concentration within the semiconductor materials of the second portion 65; with a heavy concentration of dopant being a concentration of at least about $10^{21}$ atoms/cm$^3$.

The doping of the first and second semiconductor materials 66 and 68 converts the semiconductor materials 66 and 68 of the second portion 65 into third and fourth semiconductor materials 72 and 74, respectively. The heavy dopant concentration within the semiconductor materials 72 and 74 is diagrammatically illustrated with stippling provided throughout the semiconductor materials 72 and 74. In some embodiments, the lower semiconductor material 72 may be doped to a lower overall concentration than the upper semiconductor material 74. Regardless, both semiconductor materials may be sufficiently doped to be suitably electrically conductive for subsequent incorporation into transistor gates and/or other electrically conductive components.

The first and second semiconductor materials 66 and 68 within the portion 63 of stack 62 remain in the nonconductive configuration at the processing stage of FIG. 5 (i.e., are not conductively-doped), while the semiconductor materials within the portion 65 are converted to the conductively-doped third and fourth semiconductor materials 72 and 74. In some embodiments, it is recognized that the first semiconductor material 66 and the third semiconductor material 72 were initially deposited as a layer extending across the memory-array-region 12 and the peripheral region 14 (with such layer being shown in FIG. 4). Accordingly, the semiconductor materials 66 and 72 comprise a same semiconductor composition as one another, and comprise a same thickness as one another. Similarly, the second semiconductor material 68 and the fourth semiconductor material 74 were initially deposited as a layer extending across the memory-array-region 12 and the peripheral region 14; and accordingly, the semiconductor materials 68 and 74 comprise a same semiconductor composition as one another, and comprise a same thickness as one another.

The labelling of the semiconductor materials 66, 68, 72 and 74 as first, second, third and fourth semiconductor materials, respectively, is arbitrary. In some embodiments, the semiconductor materials 66 and 72 may be referred to as the first and second semiconductor materials, respectively. In such embodiments, the semiconductor material 74 may be referred to as the third semiconductor material.

Referring to FIG. 6, the semiconductor material 68 (FIG. 5) is removed from over the memory-array-region 12 (i.e., is removed from the first portion 63 of stack 62) with an etch selective for the semiconductor material 68 relative to the insulative material 70. For purposes of understanding this disclosure and the claims that follow, an etch is considered to be "selective" for a first material relative to a second material if the etch removes the first material faster than the second material; which includes, but is not limited to, etches which are 100% selective for the first material relative to the second material.

The removal of the semiconductor material 68 may be conducted with any suitable processing. For instance, a mask (not shown) may be utilized to protect the materials associated with the peripheral region 14 while exposing the semiconductor material 68 of the memory-array-region 12 to a suitable etch; and then the mask may be removed.

Figure 7:
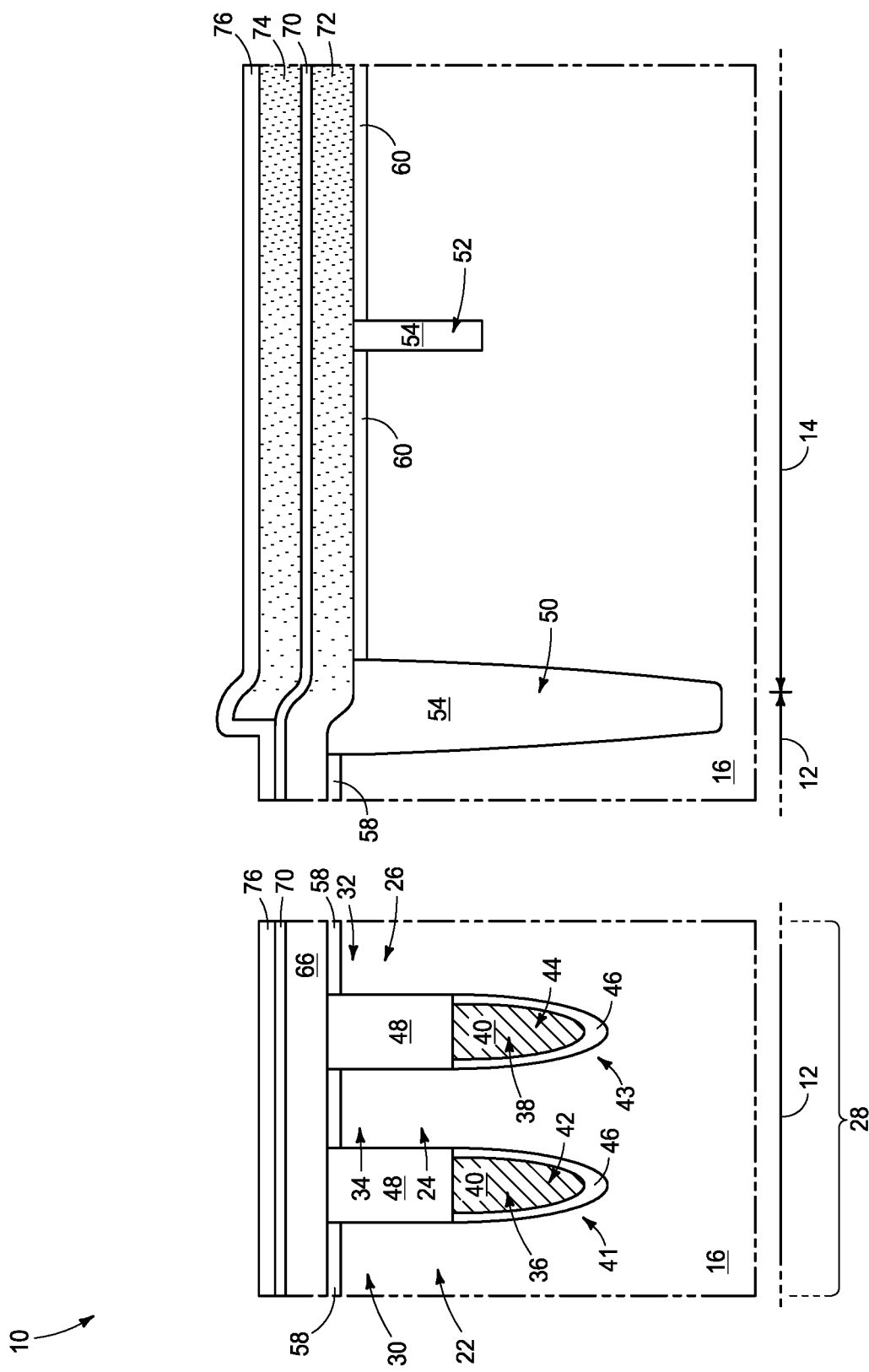

Referring to FIG. 7, a protective film 76 is formed to extend across the memory-array-region 12 and the peripheral region 14. In some embodiments, the protective film 76 may comprise, consist essentially of, or consist of silicon dioxide.

Figure 8:
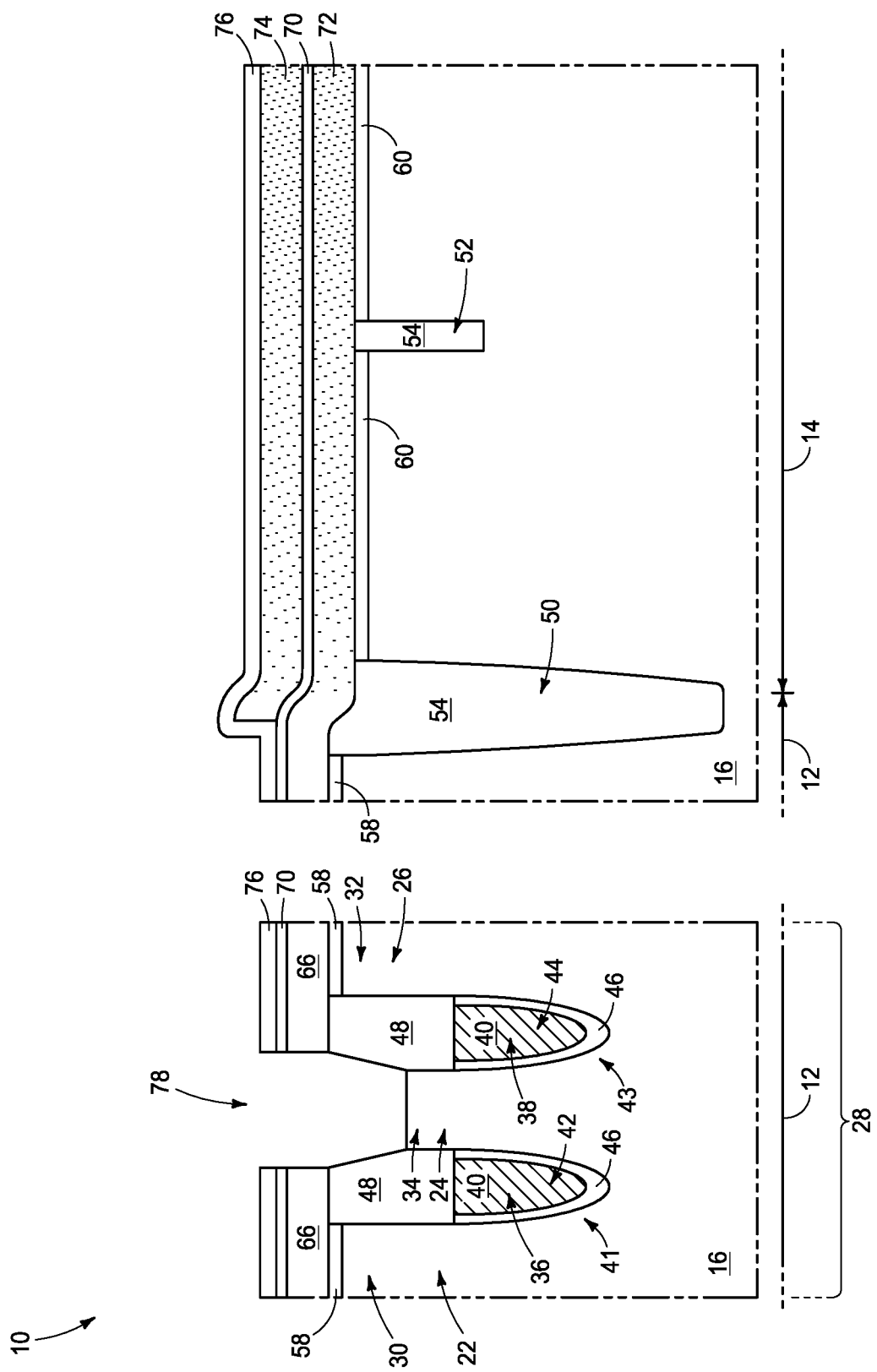

Referring to FIG. 8, an opening 78 is formed to expose the bitline-contact-location 34. The opening 78 may be formed with any suitable masking and etching.

Figure 9:
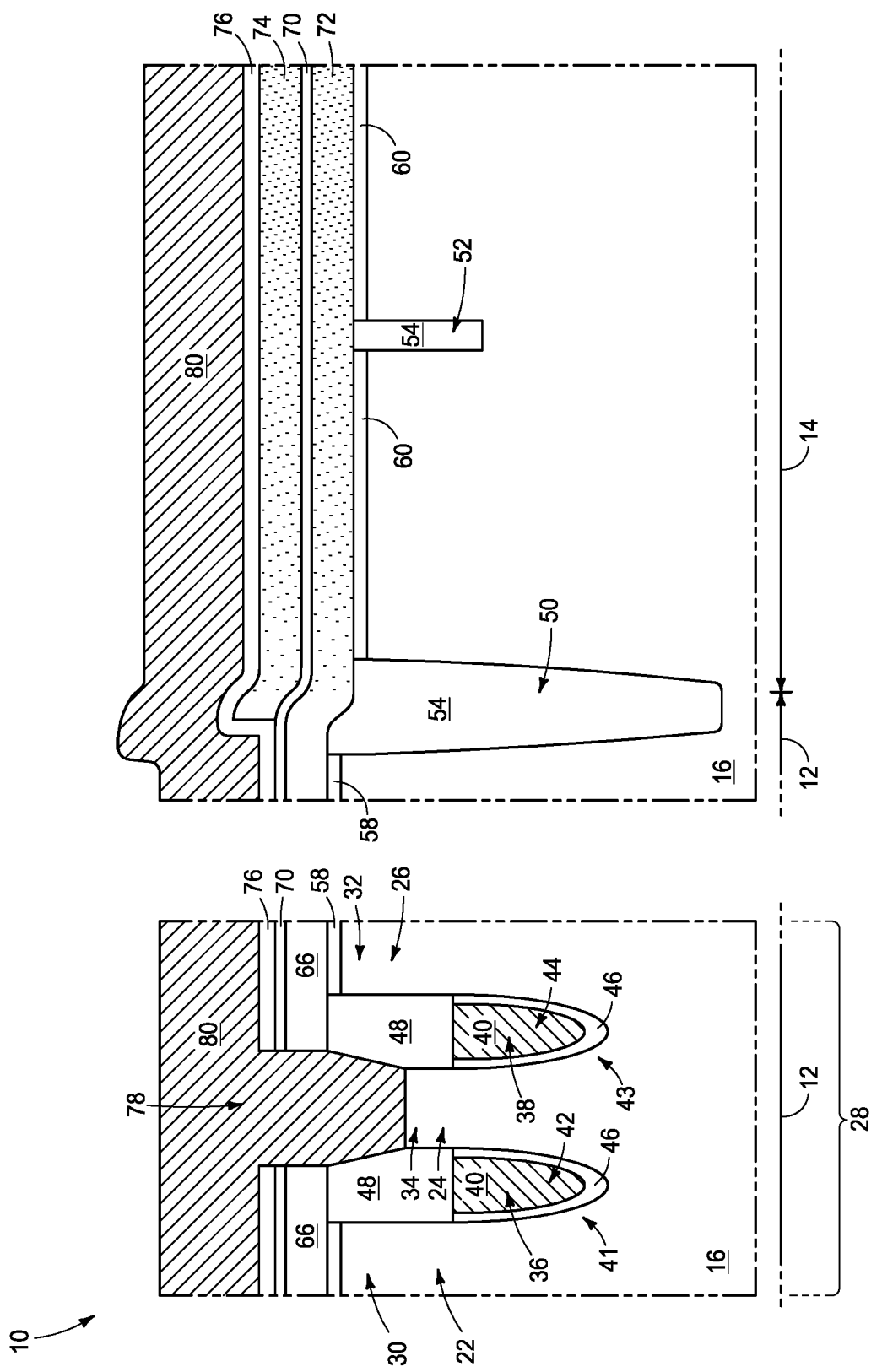

Referring to FIG. 9, conductive material 80 is formed across the memory-array-region 12 and the peripheral region 14; and fills the opening 78. The conductive material 80 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive material 80 may comprise, consist essentially of, or consist of conductively-doped silicon (e.g., conductively-doped polysilicon).

Figure 10:
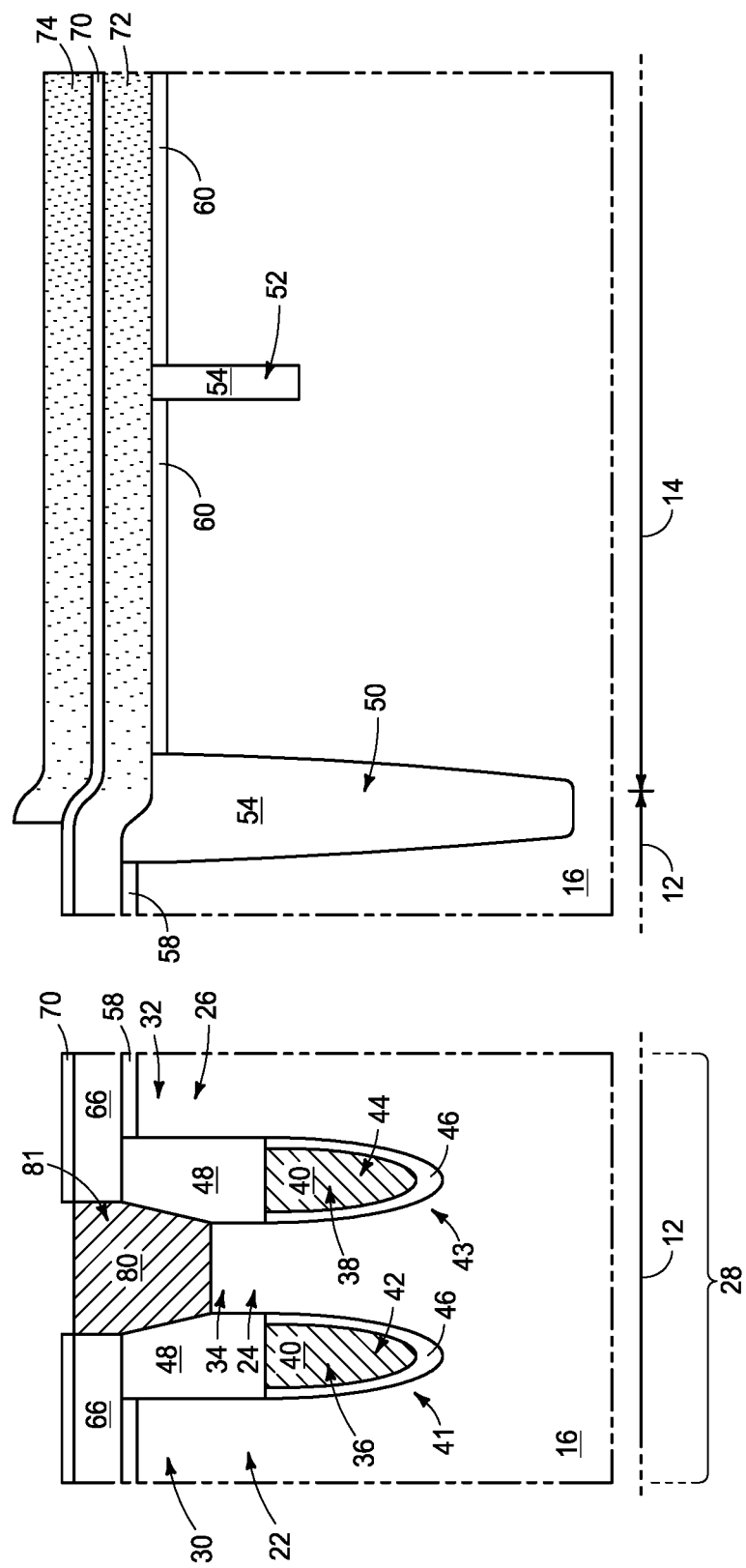

Referring to FIG. 10, the conductive material 80 is patterned into a conductive plug 81. The patterning of the conductive material 80 may utilize any suitable masking and etching.

Figure 11:
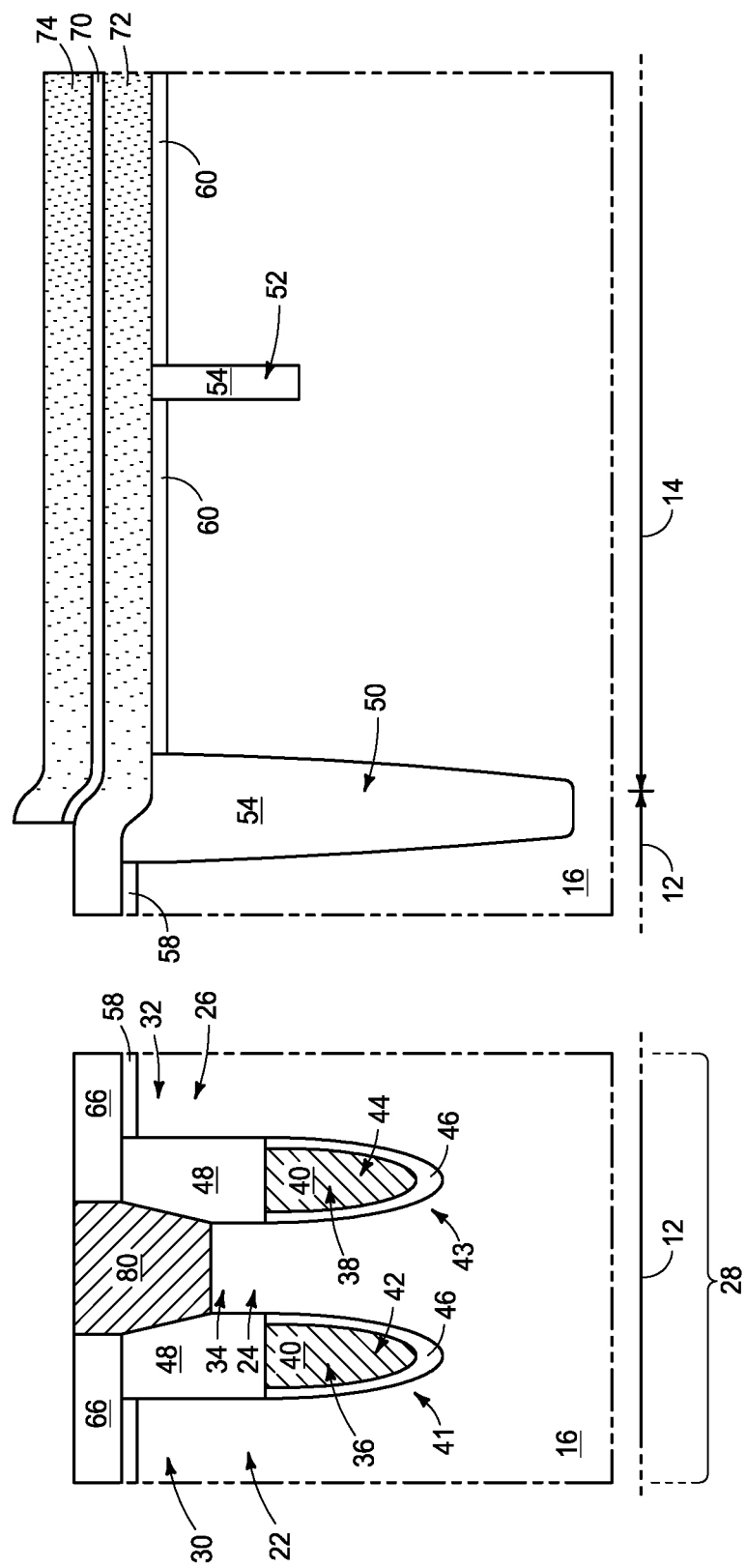

Referring to FIG. 11, exposed regions of insulative material 70 are removed. In some embodiments, such may be considered to be removal of the material 70 of the first portion 63 of the stack 62 (with such first portion 63 being shown and described above with reference to FIG. 5).

Figure 12:
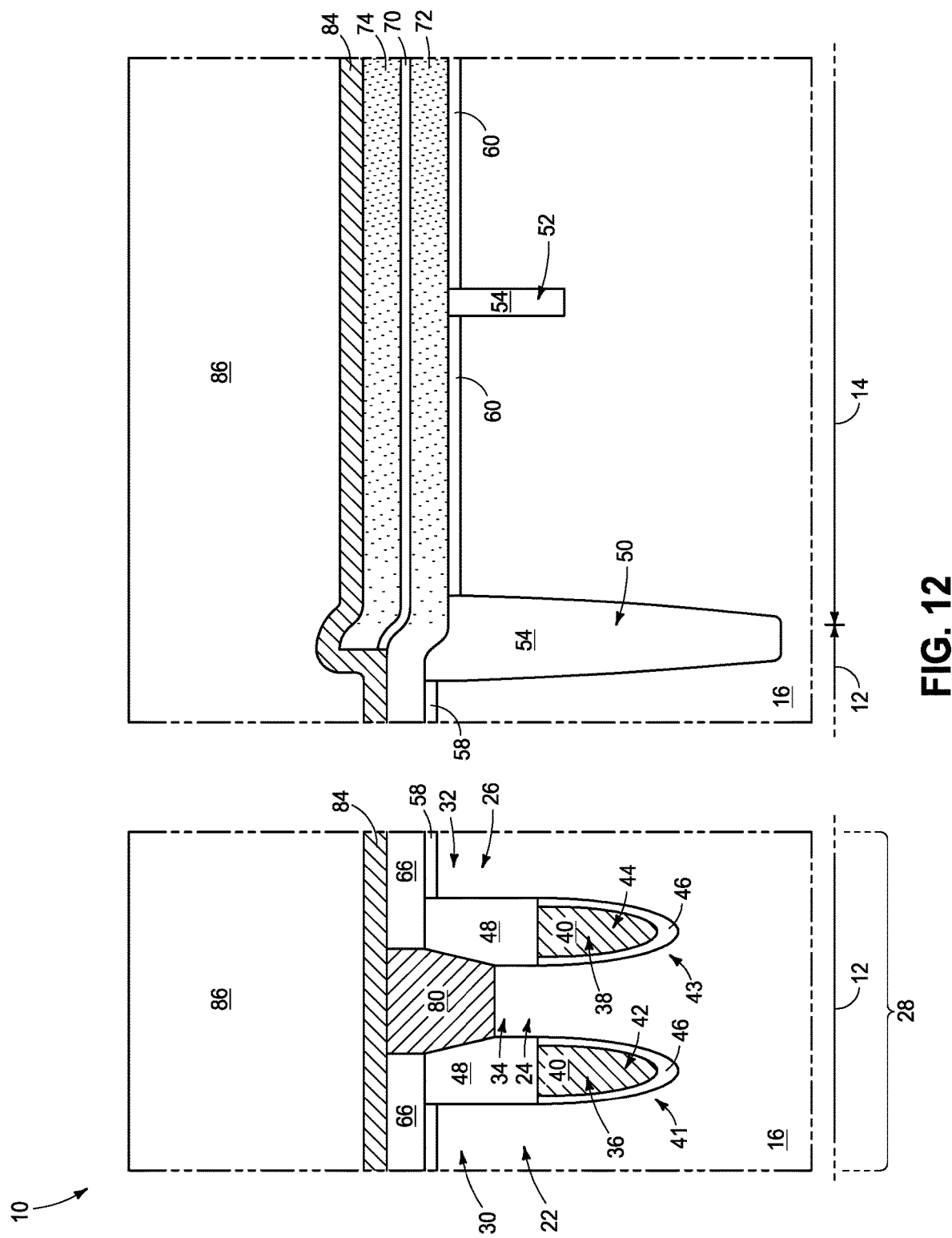

Referring to FIG. 12, conductive material 84 is formed across the memory-array-region 12 and the peripheral region 14. The conductive material 84 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive material 84 may comprise metal; and may, for example, comprise one or more of titanium, tungsten, titanium nitride, tungsten nitride, etc.

A mass of material 86 is formed over the conductive material 84. The material 86 is an insulative material, and may comprise any suitable composition(s). In some embodiments, the material 86 may comprise, consist essentially of, or consist of silicon nitride.

Referring to FIG. 13, openings 88 are formed to extend through the materials 72, 70, 74, 84 and 86 of the peripheral region 14. Such patterns the materials 72, 70, 74 and 84 into a pair of transistor gates 90 and 92. Dopant is implanted to form doped regions 89, 91, 93 and 95 adjacent the transistor gates 90 and 92. The transistor gate 90 and the source/drain regions 89 and 91 form a transistor 94; and the transistor gate 92 and the source/drain regions 93 and 95 form a transistor 96. The transistors 94 and 96 are associated with the peripheral region 14, and may be referred to as peripheral transistors (with a "peripheral transistor" being understood to be a transistor peripheral to the memory-array-region 12). The doped regions 89, 91, 93 and 95 may be p-type regions of a PMOS (p-type metal oxide semiconductor) device and/or n-type regions of an NMOS (n-type metal oxide semiconductor) device. In some embodiments, one of the transistors 94 and 96 will be a PMOS device while the other is an NMOS device; and together the transistors will form a CMOS (complementary metal oxide semiconductor) device.

The insulative region 52 is optional, and in some embodiments the source/drain regions 90 and 91 may merge together (if both comprise a same dopant type), or may join to one another along a pn junction (if they comprise different dopant types relative to another).

The transistors 94 and 96 may be utilized in any suitable applications; including, for example, logic, processors, drivers, etc.

The illustrated transistors 94 and 96 may be representative of a large number of transistors formed across the peripheral region 14.

The transistor gates 90 and 92 are example circuit structures which may comprise the materials 72, 70, 74 and 84. In other embodiments, the materials 72, 70, 74 and 84 may be incorporated into other circuit structures (e.g., wiring) in addition to, or alternatively to, the transistors 94 and 96.

Figure 14:
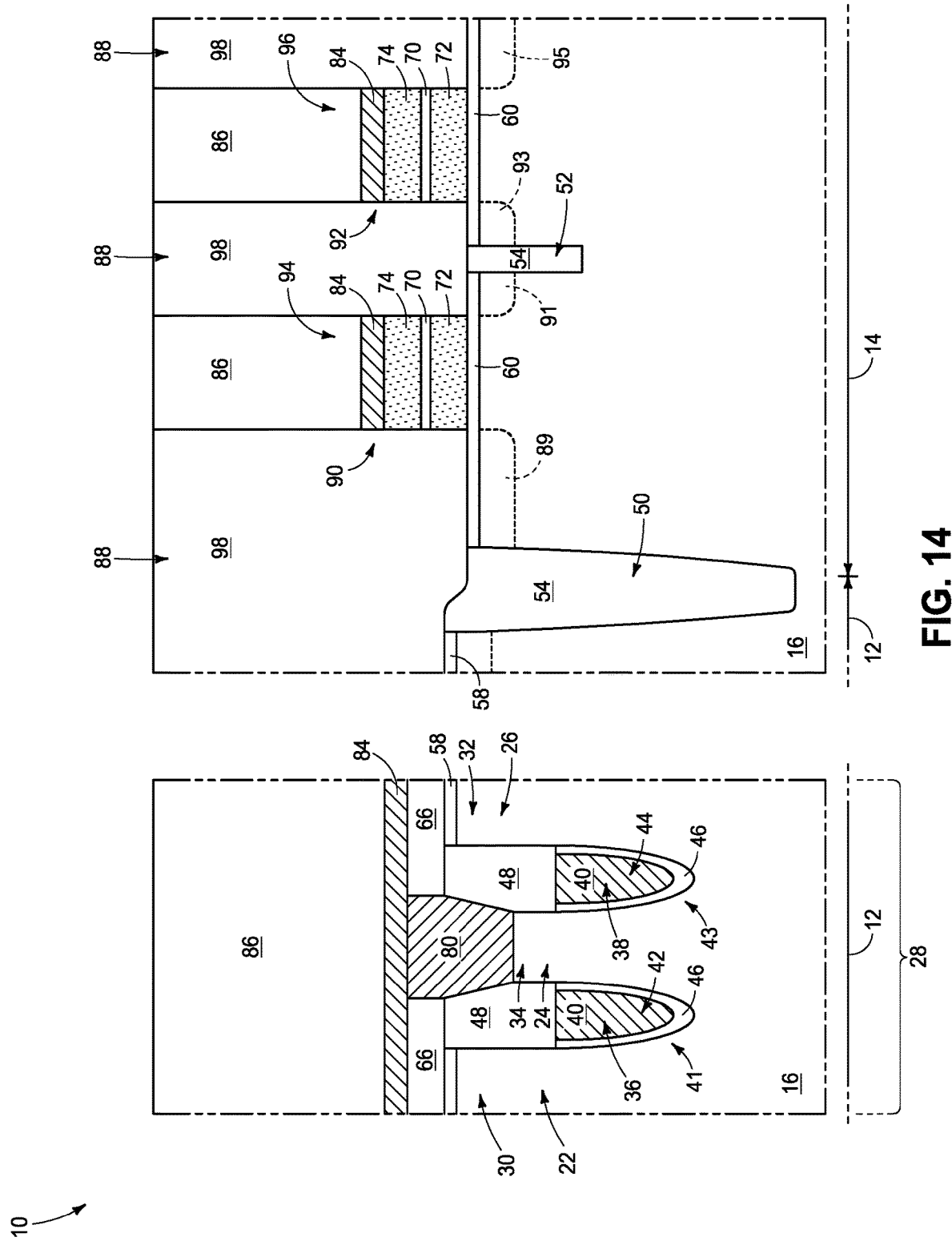

Referring to FIG. 14, insulative material 98 is deposited to fill the openings 88. The insulative material 98 may comprise any suitable composition(s); and in some embodiments may comprise, consist essentially of, or consist of silicon dioxide.

Referring to FIG. 15, openings 100 are formed over the memory-array-region 12. The openings 100 pattern the materials 80 and 84 into a conductive structure 82, and remove the conductive material 84 from over the charge-storage-device-contact-locations 30 and 32. The conductive structure 82 is coupled with the bitline-contact-location 34, and may be referred to as a bitline-contact-structure. In some embodiments, the bitline-contact-structure 82 may be referred to as a first conductive structure to distinguish it from other conductive structures.

Figure 16:
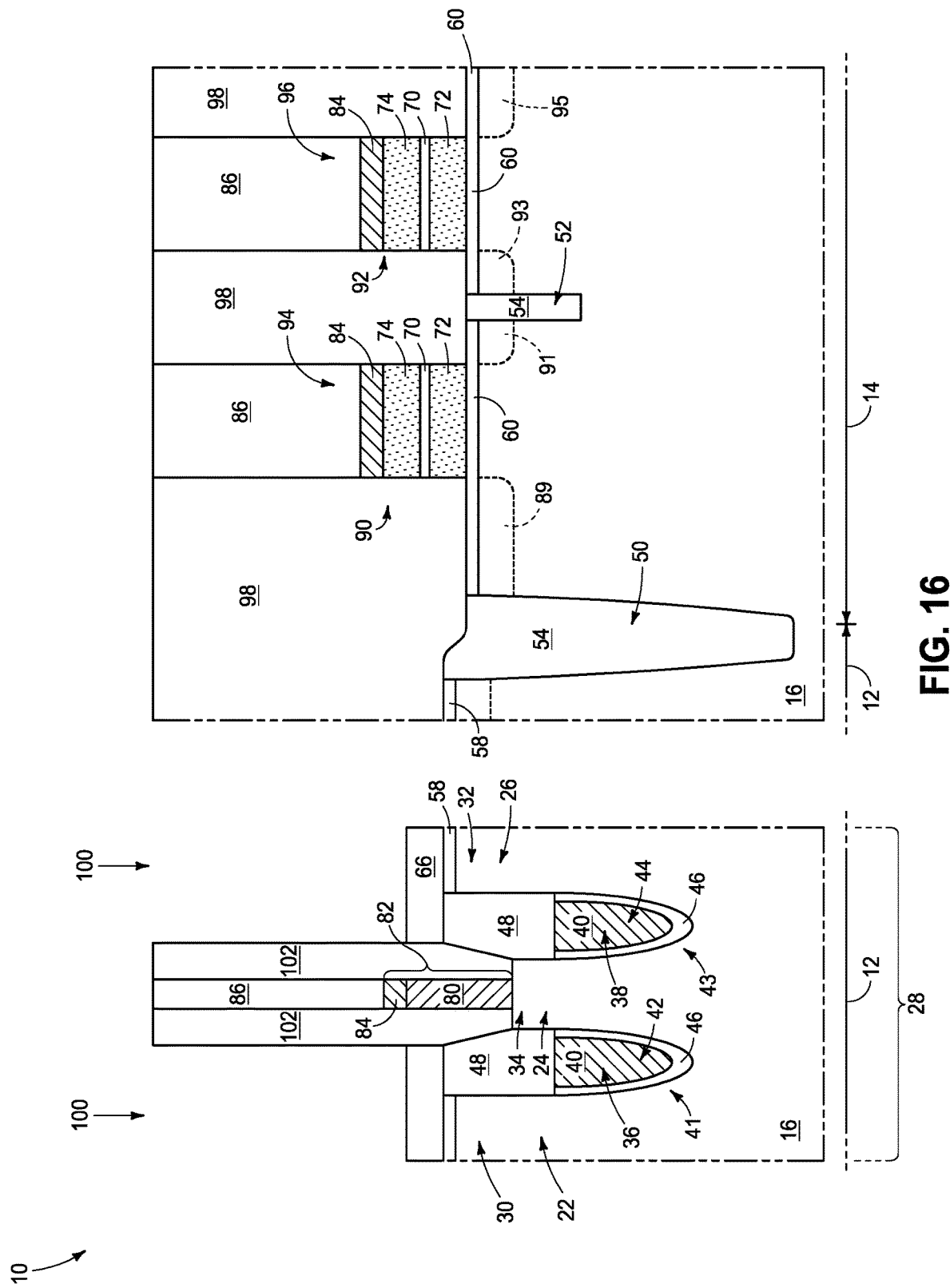

Referring to FIG. 16, insulative material 102 is formed within the openings 100 and along sides of the conductive structure 82. The insulative material 102 may comprise any suitable composition(s); and in some embodiments may comprise, consist essentially of, or consist of silicon nitride. In some embodiments, the insulative materials 48, 86 and 102 may comprise a same composition as one another (for instance, all may comprise, consist essentially of, or consist of silicon nitride), and accordingly the insulative materials 48, 86 and 102 may all merge together into a single insulative structure associated with the memory-array-region 12. FIG. 17 shows the construction 10 at a processing stage identical to that of FIG. 16, but shows the materials 48, 86 and 102 of the FIG. 16 configuration merging into a single structure 104 having a homogeneous composition 106. In some embodiments, the composition 106 may comprise, consist essentially of, or consist of silicon nitride. The structure 104 of FIG. 17 will be utilized for describing the remaining process steps of this disclosure; but it is to be understood that the invention also includes embodiments in which two or more of the materials 48, 86 and 102 of FIG. 16 are different relative to one another and accordingly do not merge into the structure 104 having the homogeneous composition 106.

Referring to FIG. 18, the openings 100 are filled with insulative material 108. The insulative material 108 may comprise any suitable composition(s); and in some embodiments may comprise, consist essentially of, or consist of silicon dioxide.

Figure 19:
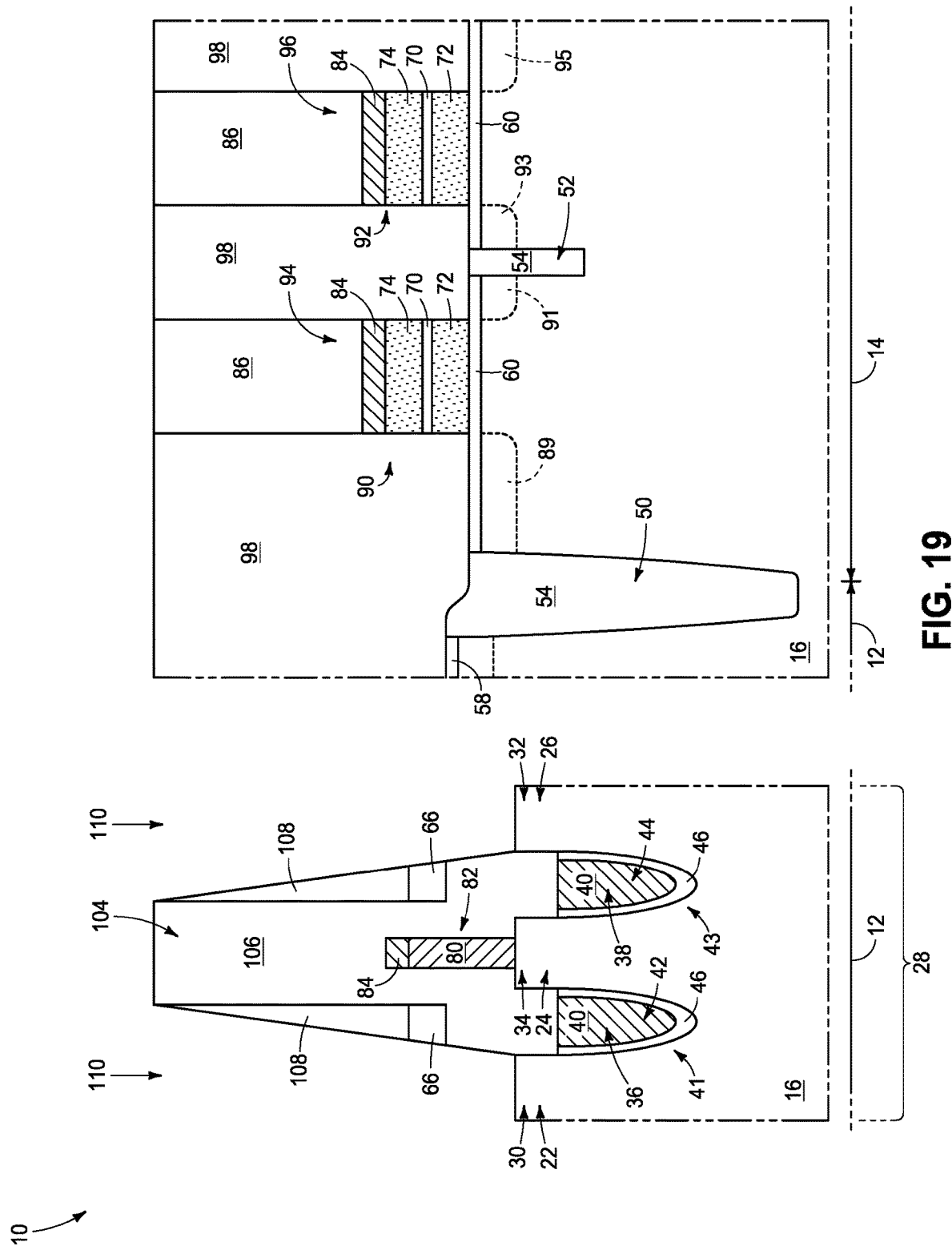

Referring to FIG. 19, openings 110 are formed to expose the charge-storage-device-contact-locations 30 and 32.

Figure 20:
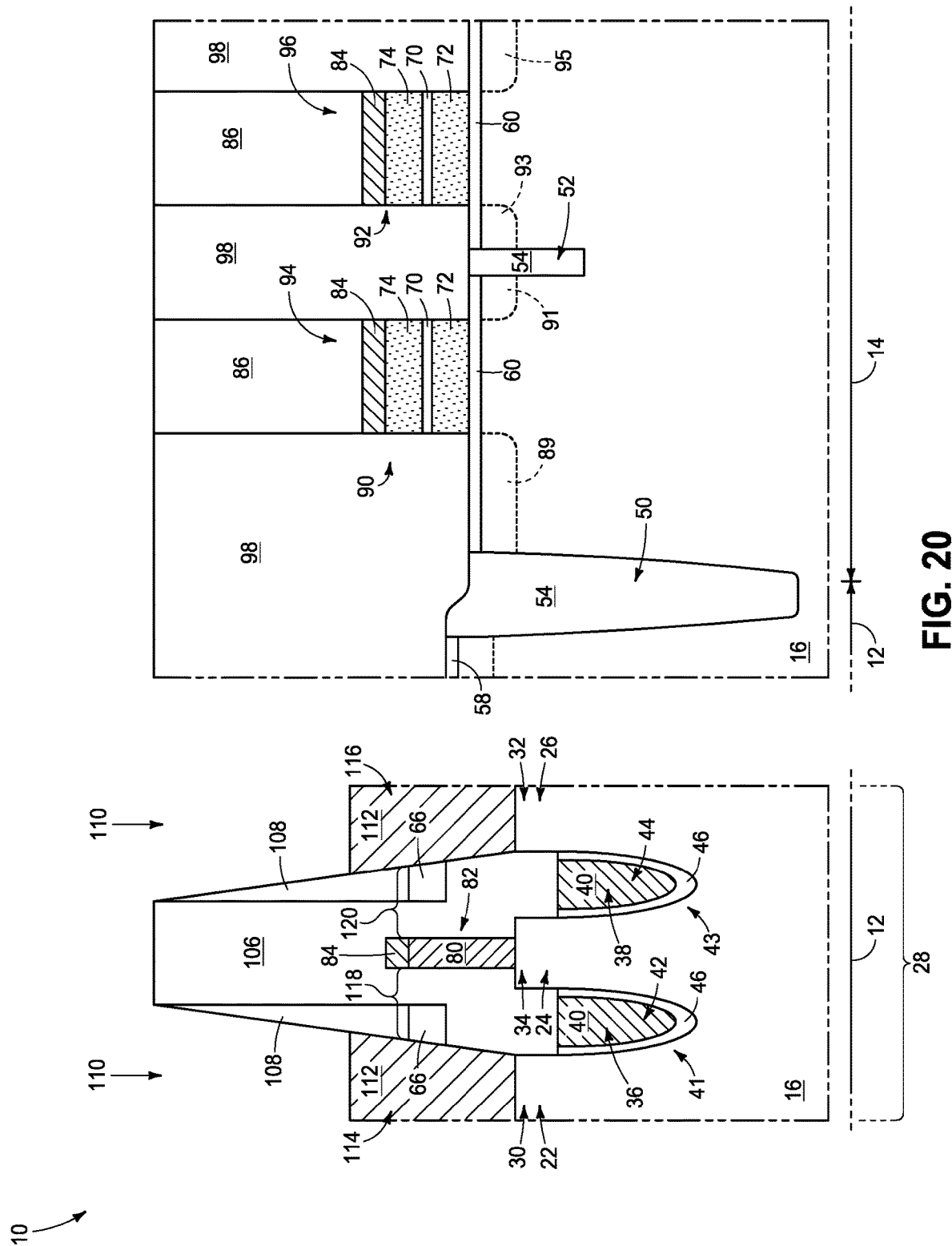

Referring to FIG. 20, conductive material 112 is deposited within the openings 110. The conductive material 112 is patterned into first and second charge-storage-device-contact-structures 114 and 116. The conductive material 112 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive material 112 may comprise metal; and may, for example, comprise one or more of titanium nitride, tungsten nitride, tungsten, titanium, titanium silicide, tungsten silicide, titanium silicon nitride, tungsten silicon nitride, etc.

In some embodiments, the charge-storage-device-contact-structures 114 and 116 may be referred to as second and third conductive structures, respectively, to distinguish them from one another, and to distinguish them from the first conductive structure 82 corresponding to the bitline-contact-structure.

The construction 10 of FIG. 20 comprises a first insulative region 118 between the conductive structures 82 and 114 (i.e., between the bitline-contact-structure 82 and the first charge-storage-device-contact-structure 114), and comprises a second insulative region 120 between the conductive structures 82 and 116 (i.e., between the bitline-contact-structure 82 and the second charge-storage-device-contact-structure 116). The first and second insulative regions 118 and 120 each comprise portions of the semiconductor material 66 in the nonconductive configuration (i.e., which is not conductively-doped). The first and second insulative regions 118 and 120 also comprise insulative materials 106 and 108 in addition to the insulative semiconductor material 66.

It is noted that the transistor gates 90 and 92 associated with the peripheral region 14 comprise semiconductor material 72 which was deposited at the same processing stage as the insulative semiconductor material 66 (specifically, the processing stage of FIG. 4), and accordingly which has the same semiconductor composition and the same thickness as the semiconductor material 66. However, the semiconductor material 72 is in a conductive configuration while the semiconductor material 66 is in a nonconductive configuration.

Figure 21:
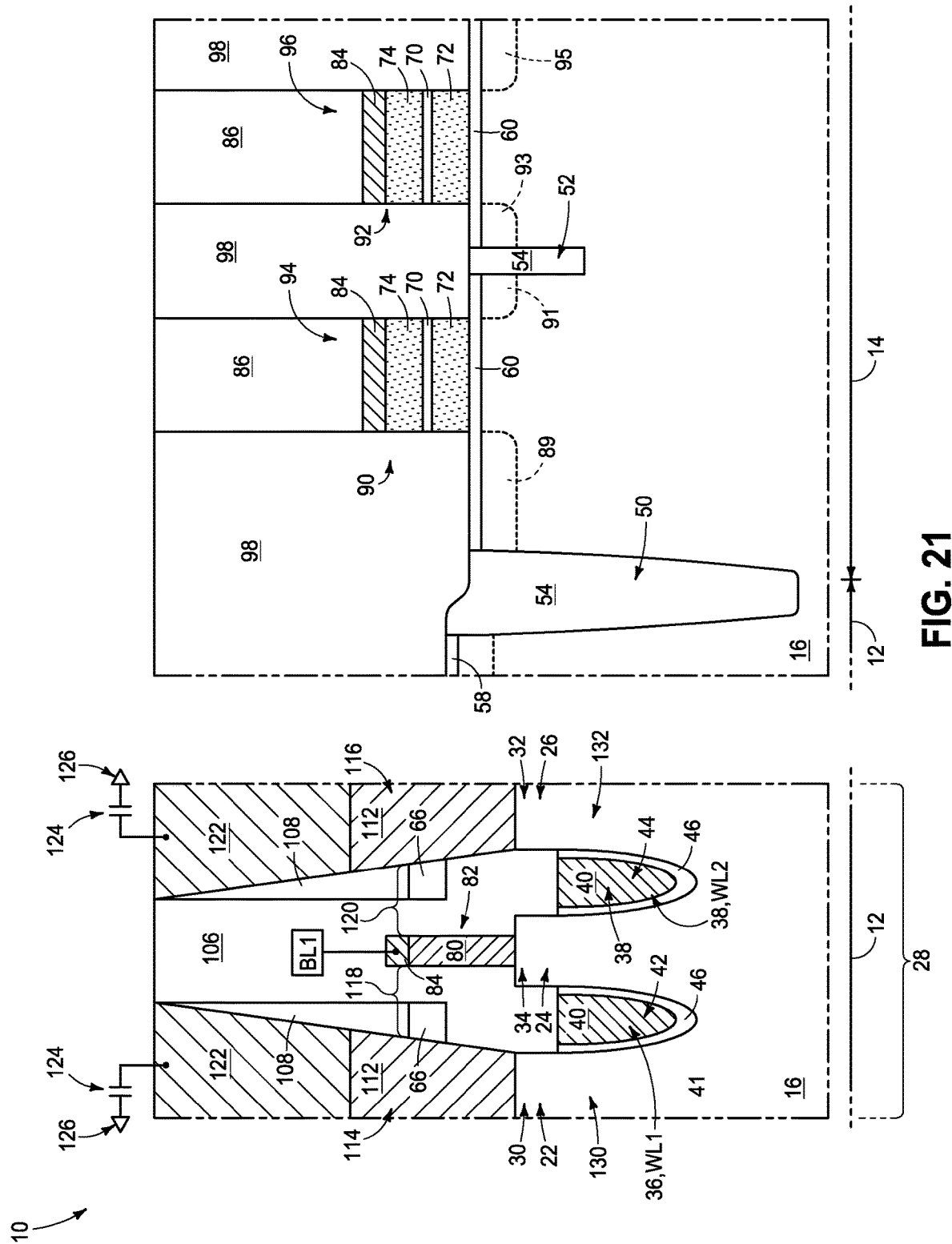

Referring to FIG. 21, additional conductive material 122 is formed over the charge-storage-device-contact-structures 114 and 116. Capacitors 124 are coupled with the charge-storage-device-contact-locations 30 and 32 through the conductive materials 122 and 112. Each of the capacitors has a node coupled to a reference voltage 126. The reference voltage may be ground, or any other suitable voltage. The capacitors may or may not include at least a portion of one or both of the conductive materials 112 and 122. The capacitors 124 are example charge-storage devices. In other embodiments, other charge-storage devices (e.g., phase-change devices, conductive-bridging devices, etc.) may be utilized.

A bitline, BL1, is coupled with the bitline-contact-structure 82. The bitline may or may not include at least a portion of the bitline-contact-structure. The first and second wordlines 36 and 38 are shown to correspond to wordlines WL1 and WL2, respectively.

The paired-memory-cell-region 28 of FIG. 21 comprises a pair of neighboring memory cells 130 and 132. The memory cell 130 includes the transistor gate 42 and one of the capacitors 124; and the memory cell 132 includes the transistor gate 44 and the other of the capacitors 124. The memory cells 130 and 132 share the bitline-contact-location 34. The neighboring memory cells comprise the first, second and third pillars 22, 24 and 26 of the base-semiconductor-material 16. The memory cell 130 may be referred to as a first memory cell, and such includes a first of the capacitors 124 coupled with the bitline BL1 through the gate 42 associated with the wordline WL1. The memory cell 132 may be referred to as a second memory cell, and such includes a second of the capacitors 124 coupled with the bitline BL1 through the gate 44 associated with the wordline WL2.

Figure 22:
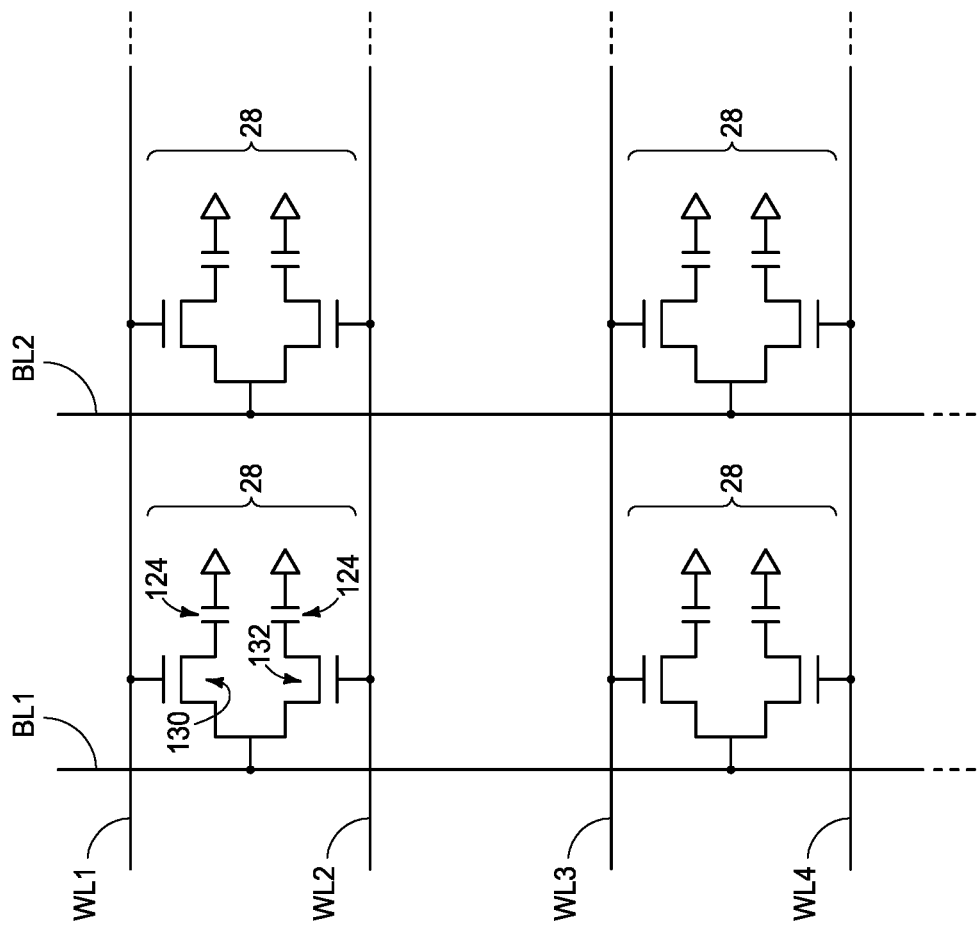
FIG. 22 is a schematic view of a region of an example memory array.

The paired-memory-cell-region 28 may be one of a plurality of substantially identical paired-memory-cell-regions across a memory array. FIG. 22 illustrates a region of an example DRAM array comprising a plurality of paired-memory-cell-regions 28. The illustrated region of the DRAM array includes wordlines WL1, WL2, WL3 and WL4; and includes bitlines BL1 and BL2. The wordlines may be considered to extend along rows of the memory array, and the bitlines may be considered to extend along columns of the memory array. The illustrated region of the memory array comprises four of the paired-memory-cell-regions 28. It is to be understood that a memory array may comprise any suitable number of the paired-memory-cell-regions 28; and in some embodiments may comprise thousands, millions, hundreds of millions, etc. of paired-memory-cell-regions.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multi-chip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly which includes a construction comprising a memory-array-region and a peripheral region proximate the memory-array-region. A paired-memory-cell-region is within the memory-array-region. The paired-memory-cell-region includes a bitline-contact-structure between a first charge-storage-device-contact-structure and a second charge-storage-device-contact-structure. A first insulative region is between the bitline-contact-structure and the first charge-storage-device-contact-structure. A second insulative region is between the bitline-contact-structure and the second charge-storage-device-contact-structure. The first and second insulative regions both include a first semiconductor material which is not conductively-doped, and which instead is in a nonconductive configuration. One or more transistor gates are over the peripheral region. The one or more transistor gates have a second semiconductor material which is a same semiconductor composition as the first semiconductor material, and which has a same thickness as the first semiconductor material. The second semiconductor material is conductively-doped in the one or more transistor gates.

Some embodiments include an integrated assembly comprising a memory-array-region. The memory-array-region has a base-semiconductor-material. Trenches extend into the base-semiconductor-material. A cross-section along the memory-array-region including a paired-memory-cell-region having two neighboring trenches extending into the base-semiconductor-material. The trenches are a first trench and a second trench. A first pillar of the base-semiconductor-material is on one side of the first trench. A second pillar of the base-semiconductor-material is between the first and second trenches, and is on an opposing side of the first trench from the first pillar of the base-semiconductor-material. A third pillar of the base-semiconductor-material is on an opposing side of the second trench from the second pillar of the base-semiconductor-material. The first and third pillars of the base-semiconductor-material comprise first and second charge-storage-device-contact-locations, respectively. The second pillar of the base-semiconductor-material comprises a bitline-contact-location. First and second wordlines are within the first and second trenches, respectively. The first wordline comprises a first gate along the cross-section, and the second wordline comprises a second gate along the cross-section. The first gate gatedly couples the bitline-contact-location with the first charge-storage-device-contact-location, and the second gate gatedly couples the bitline-contact-location with the second charge-storage-device-contact-location. A first conductive structure is coupled with the bitline-contact-location. Second and third conductive structures are coupled with the first and second charge-storage-device-contact-locations, respectively. A first insulative region is between the first and second conductive structures. A second insulative region is between the second and third conductive structures. The first and second insulative regions both comprise a first semiconductor material which is not conductively-doped, and which instead is in a nonconductive configuration.

Some embodiments include a method of forming an integrated assembly. A construction is provided to comprise a memory-array-region having a base-semiconductor-material. Trenches are formed to extend into the base-semiconductor-material of the memory-array-region. A cross-section along the memory-array-region includes a paired-memory-cell-region having two neighboring trenches extending into the base-semiconductor-material. The trenches are a first trench and a second trench. A first pillar of the base-semiconductor-material is on one side of the first trench. A second pillar of the base-semiconductor-material is between the first and second trenches, and is on an opposing side of the first trench from the first pillar of the base-semiconductor-material. A third pillar of the base-semiconductor-material is on an opposing side of the second trench from the second pillar of the base-semiconductor-material. The first and third pillars of the base-semiconductor-material comprise first and second charge-storage-device-contact-locations, respectively. The second pillar of the base-semiconductor-material comprises a bitline-contact-location. A first conductive structure is formed to be coupled with the bitline-contact-location. Second and third conductive structures are formed to be coupled with the first and second charge-storage-device-contact-locations, respectively. A first insulative region is between the first and second conductive structures, and a second insulative region is formed between the second and third conductive structures. The first and second insulative regions both comprise a first semiconductor material which is not conductively-doped, and which instead is in a nonconductive configuration.

Some embodiments include a method of forming an integrated assembly. A construction is provided to comprise a memory-array-region and a peripheral region proximate the memory-array-region. The construction includes a base-semiconductor-material within the memory-array-region and within the peripheral region. Trenches are formed to extend into the base-semiconductor-material of the memory-array-region. A cross-section along the memory-array-region includes a paired-memory-cell-region having two neighboring trenches extending into the base-semiconductor-material. The trenches are a first trench and a second trench. A first pillar of the base-semiconductor-material is on one side of the first trench. A second pillar of the base-semiconductor-material is between the first and second trenches, and is on an opposing side of the first trench from the first pillar of the base-semiconductor-material. A third pillar of the base-semiconductor-material is on an opposing side of the second trench from the second pillar of the base-semiconductor-material. The first and third pillars of the base-semiconductor-material comprise first and second charge-storage-device-contact-locations, respectively. The second pillar of the base-semiconductor-material comprises a bitline-contact-location. A first wordline is formed within the first trench, and a second wordline is formed within the second trench. The first wordline comprises a first gate along the cross-section, and the second wordline comprises a second gate along the cross-section. The first gate gatedly couples the bitline-contact-location with the first charge-storage-device-contact-location, and the second gate gatedly couples the bitline-contact-location with the second charge-storage-device-contact-location. A stack is formed to have a first a portion over the memory-array-region and to have a second portion over the peripheral region. The stack includes an insulative material over a first semiconductor material, and includes a second semiconductor material over the insulative material. The first and second semiconductor materials within the stack not being conductively-doped, and instead are in a nonconductive configuration. The first and second semiconductor materials of the second portion of the stack are conductively doped while leaving the first and second semiconductor materials of the first portion of the stack in the nonconductive configuration. The second semiconductor material and the insulative material are removed from the first portion of the stack. The conductively-doped first semiconductor material, the insulative material and the conductively-doped second semiconductor material are incorporated into one or more transistor gates associated with the peripheral region. A bitline is coupled with the bitline-contact-location. Capacitors are coupled with the charge-storage-device-contact-locations.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A method of forming an integrated assembly, comprising:
providing a construction comprising a memory-array-region having a base-semiconductor-material;
forming trenches extending into the base-semiconductor-material of the memory-array-region; a cross-section along the memory-array-region including a paired-memory-cell-region having two neighboring trenches extending into the base-semiconductor-material; the trenches being a first trench and a second trench; a first pillar of the base-semiconductor-material being on one side of the first trench; a second pillar of the basesemiconductor-material being between the first and second trenches, and being on an opposing side of the first trench from the first pillar of the base-semiconductor-material; a third pillar of the base-semiconductor-material being on an opposing side of the second trench from the second pillar of the base-semiconductor-material; the first and third pillars of the base-semiconductor-material comprising first and second charge-storage-device-contact-locations, respectively; the second pillar of the base-semiconductor-material comprising a bitline-contact-location;

forming a first conductive structure coupled with the bitline-contact-location;

forming second and third conductive structures coupled with the first and second charge-storage-device-contact-locations, respectively; and forming a first insulative region between the first and second conductive structures, and forming a second insulative region between the second and third conductive structures; the first and second insulative regions both comprising a first semiconductor material which is in a nonconductive configuration.

2. The method of claim 1 comprising coupling the first conductive structure with a bitline, coupling the second conductive structure with a first charge-storage device, and coupling the third conductive structure with a second charge-storage device; a neighboring pair of memory cells comprising the first, second and third pillars of the base-semiconductor-material, together with the first and second charge-storage devices; the neighboring pair of memory cells and sharing a connection to the bitline which extends through the second conductive structure.

3. The method of claim 1 comprising coupling the first conductive structure with a bitline, coupling the second conductive structure with a first capacitor, and coupling the third conductive structure with a second capacitor; a neighboring pair of memory cells comprising the first, second and third pillars of the base-semiconductor-material, together with the first and second capacitors; the neighboring pair of memory cells and sharing a connection to the bitline which extends through the second conductive structure.

4. The method of claim 1 wherein the first and second insulative regions include insulative material in addition to the first semiconductor material.

5. The method of claim 4 wherein the insulative material comprises silicon nitride.

6. The method of claim 1 wherein the construction includes a peripheral region proximate the memory-array-region; the method comprising forming one or more transistor gates over the peripheral region; said one or more transistor gates being formed to have a second semiconductor material which is a same semiconductor composition as the first semiconductor material, and which is a same thickness as the first semiconductor material; the second semiconductor material being conductively-doped.

7. The method of claim 6 wherein said one or more transistor gates are formed to include a third semiconductor material over the second semiconductor material, the third semiconductor material being spaced from the second semiconductor material by an insulative material.

8. The method of claim 7 wherein the insulative material comprises silicon dioxide.

9. The method of claim 7 wherein the third semiconductor material comprises the same semiconductor composition as the first and second semiconductor materials.

10. The method of claim 7 wherein the third semiconductor material comprises a different semiconductor composition relative to the first and second semiconductor materials.

11. A method of forming an integrated assembly, comprising:

providing a construction comprising a memory-array-region, and comprising a peripheral region proximate the memory-array-region; the construction including a base-semiconductor-material within the memory-array-region and within the peripheral region;

forming trenches extending into the base-semiconductor-material of the memory-array-region; a cross-section along the memory-array-region including a paired-memory-cell-region having two neighboring trenches extending into the base-semiconductor-material; the trenches being a first trench and a second trench; a first pillar of the base-semiconductor-material being on one side of the first trench; a second pillar of the base-semiconductor-material being between the first and second trenches, and being on an opposing side of the first trench from the first pillar of the base-semiconductor-material; a third pillar of the base-semiconductor-material being on an opposing side of the second trench from the second pillar of the base-semiconductor-material; the first and third pillars of the base-semiconductor-material comprising first and second charge-storage-device-contact-locations, respectively; the second pillar of the base-semiconductor-material comprising a bitline-contact-location;

forming a first wordline within the first trench, and forming a second wordline within the second trench; the first wordline comprising a first gate along the cross-section, and the second wordline comprising a second gate along the cross-section; the first gate gatedly coupling the bitline-contact-location with the first charge-storage-device-contact-location, and the second gate gatedly coupling the bitline-contact-location with the second charge-storage-device-contact-location;

forming a stack having a first a portion over the memory-array-region and having a second portion over the peripheral region; the stack including an insulative material over a first semiconductor material, and including a second semiconductor material over the insulative material; the first and second semiconductor materials within the stack not being conductively-doped and instead being in a nonconductive configuration;

conductively doping the first and second semiconductor materials of the second portion of the stack while leaving the first and second semiconductor materials of the first portion of the stack in the nonconductive configuration;

removing the second semiconductor material and the insulative material from the first portion of the stack;

incorporating the conductively-doped first semiconductor material, the insulative material and the conductively-doped second semiconductor material into one or more transistor gates associated with the peripheral region;

forming a bitline coupled with the bitline-contact-location; and forming charge-storage devices coupled with the charge-storage-device-contact-locations.

12. The method of claim 11 wherein the insulative material comprises silicon dioxide.

13. The method of claim 11 wherein the insulative material comprises a thickness within a range of from greater than or equal to about 10 Å to less than or equal to about 100 Å.

14. The method of claim 11 wherein the first and second semiconductor materials comprise the same semiconductor composition as one another.

15. The method of claim 14 wherein the first and second semiconductor materials comprise silicon.

16. The method of claim 14 wherein the first and second semiconductor materials consist of silicon.

17. The method of claim 11 wherein the first and second semiconductor materials comprise different semiconductor compositions relative to one another.

* * * * *